(12) United States Patent
Murayama et al.

(10) Patent No.: US 11,817,381 B2
(45) Date of Patent: Nov. 14, 2023

(54) SEMICONDUCTOR DEVICE

(71) Applicant: Shinko Electric Industries, Co., Ltd., Nagano (JP)

(72) Inventors: Kei Murayama, Nagano (JP); Mitsuhiro Aizawa, Nagano (JP); Amane Kaneko, Nagano (JP); Kiyoshi Oi, Nagano (JP)

(73) Assignee: SHINKO ELECTRIC INDUSTRIES CO., LTD., Nagano-Ken (JP)

( * ) Notice: Subject to any disclaimer, the term of this patent is extended or adjusted under 35 U.S.C. 154(b) by 0 days.

(21) Appl. No.: 17/376,478

(22) Filed: Jul. 15, 2021

(65) Prior Publication Data

US 2022/0028774 A1    Jan. 27, 2022

(30) Foreign Application Priority Data

Jul. 21, 2020 (JP) .................. 2020-124231

(51) Int. Cl.
 *H01L 23/498* (2006.01)
 *H01L 23/31* (2006.01)

(52) U.S. Cl.
 CPC .... *H01L 23/49833* (2013.01); *H01L 23/3121* (2013.01); *H01L 23/49811* (2013.01); *H01L 23/49822* (2013.01)

(58) Field of Classification Search
 CPC .......................... H01L 23/49833; H01L 23/31; H01L 23/3107
 See application file for complete search history.

(56) References Cited

U.S. PATENT DOCUMENTS

| 2012/0241953 A1 | 9/2012 | Yamada |
| 2015/0179551 A1 | 6/2015 | Nakamura |
| 2016/0061885 A1 | 3/2016 | Takematsu |

FOREIGN PATENT DOCUMENTS

| EP | 2530712 A2 | 2/2012 |
| EP | 2814059 A1 | 12/2012 |
| JP | 2018120902 A | 8/2018 |

OTHER PUBLICATIONS

Extended European Search Report for corresponding European Application No. 21 18 6343 dated Nov. 26, 2021.

*Primary Examiner* — Michele Fan
(74) *Attorney, Agent, or Firm* — TAROLLI, SUNDHEIM, COVELL & TUMMINO L.L.P

(57) ABSTRACT

A semiconductor device includes a lower substrate, a semiconductor element mounted on an upper surface of the lower substrate, an upper substrate disposed on an upper surface of the semiconductor element, an encapsulation resin disposed between the lower substrate and the upper substrate and encapsulating the semiconductor element, a wiring layer disposed on an upper surface of the upper substrate, and a covering resin formed from a material having a coefficient of thermal expansion similar to a coefficient of thermal expansion of the encapsulation resin. The covering resin is disposed on the upper surface of the upper substrate and covers a side surface of the wiring layer.

13 Claims, 14 Drawing Sheets

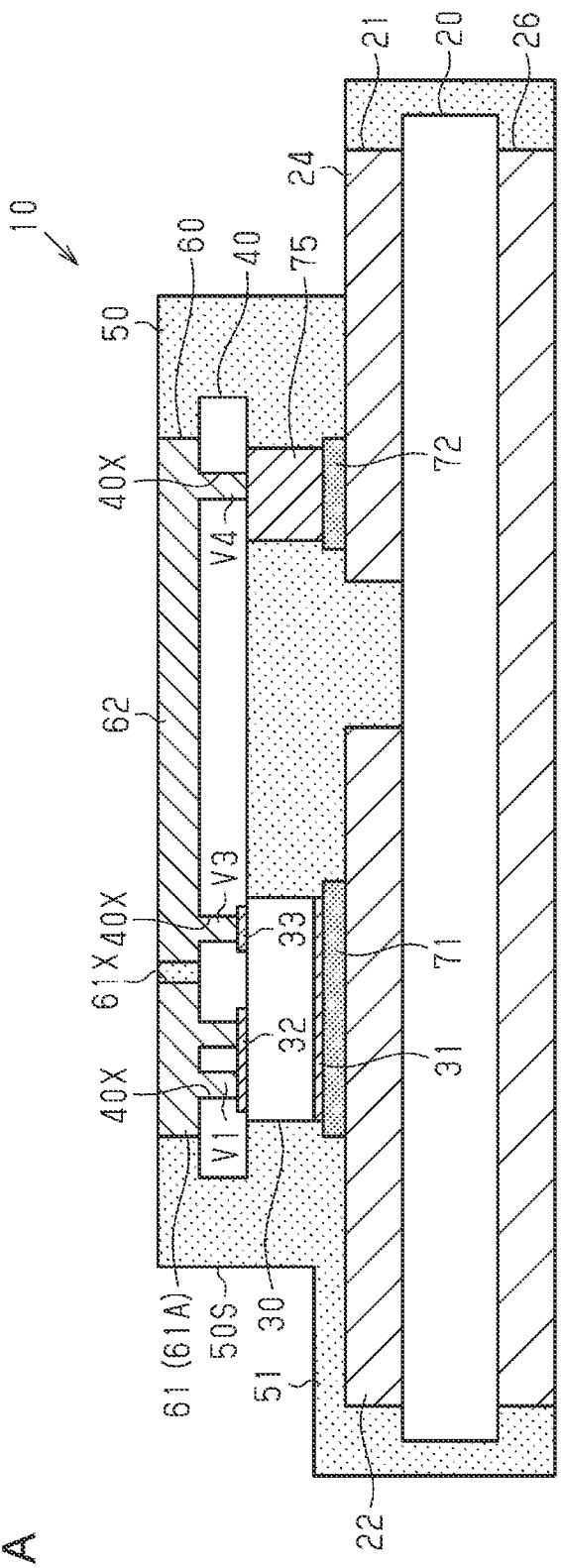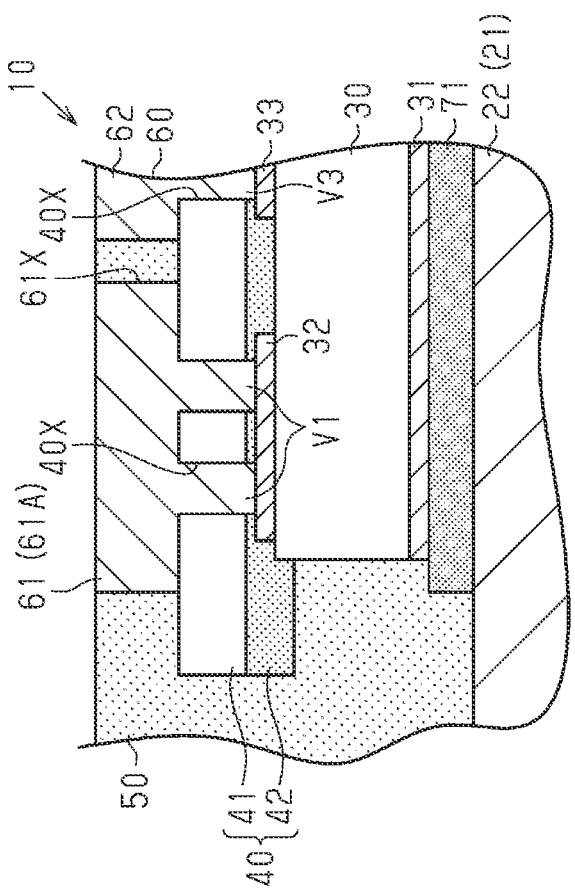

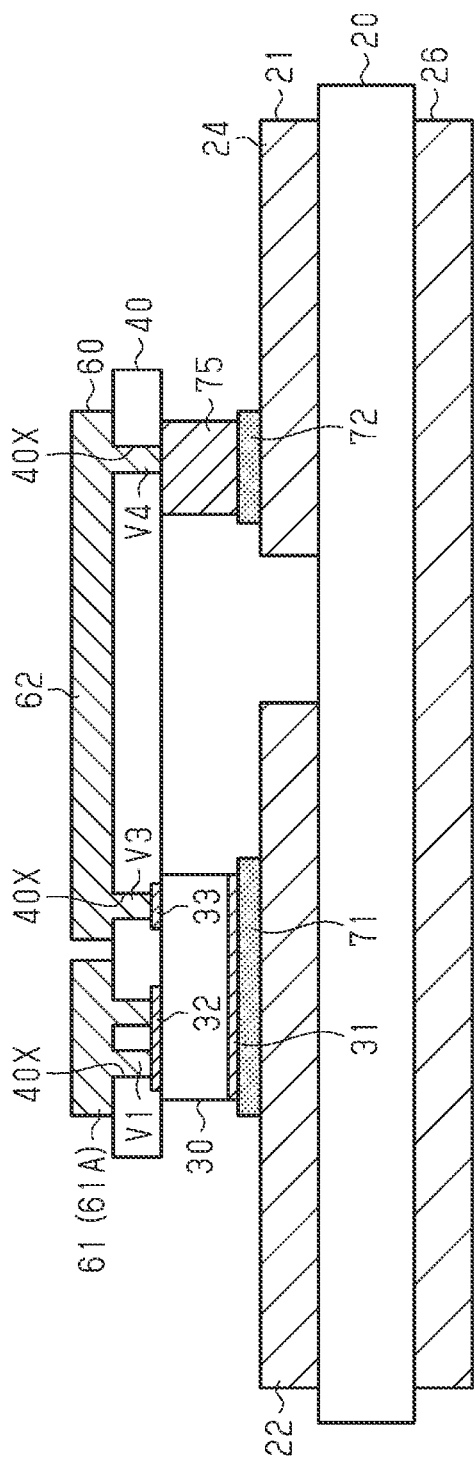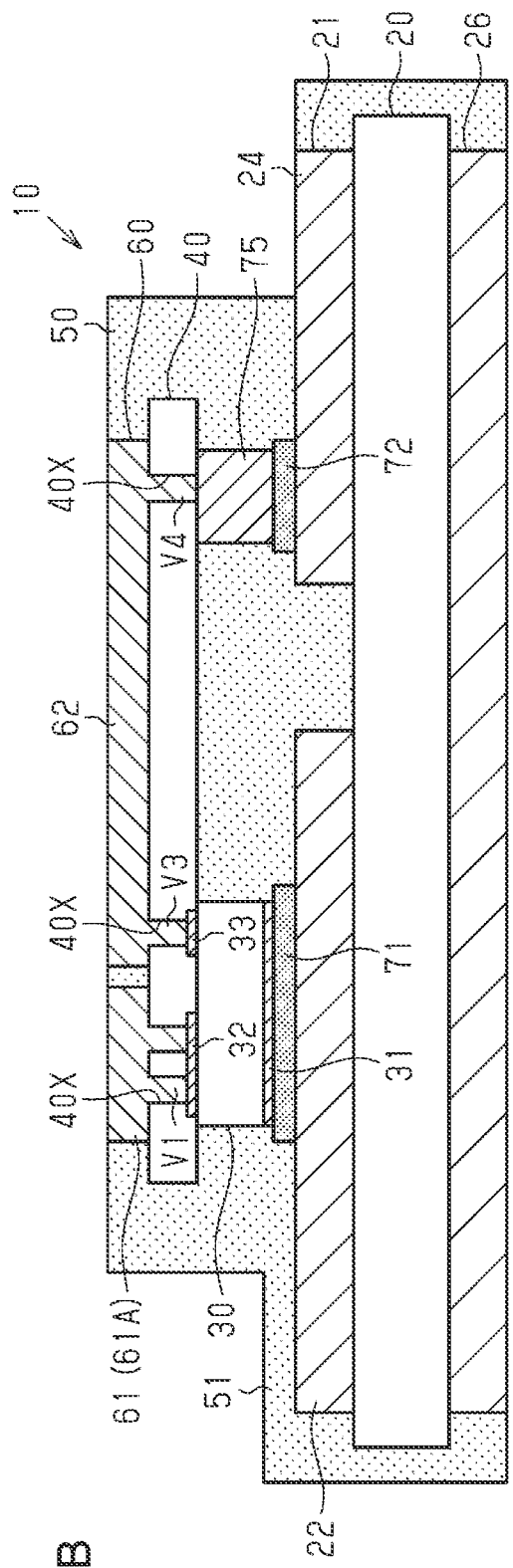

SEMICONDUCTOR DEVICE

CROSS-REFERENCE TO RELATED APPLICATIONS

This application is based upon and claims the benefit of priority from prior Japanese Patent Application No. 2020-124231, filed on Jul. 21, 2020, the entire contents of which are incorporated herein by reference.

FIELD

This disclosure relates to a semiconductor device.

BACKGROUND

A power semiconductor device (power module) is a known semiconductor device that controls and supplies power. This type of semiconductor device may include a semiconductor element mounted between a lower substrate and an upper substrate, an encapsulation resin disposed between the lower substrate and the upper substrate to encapsulate the semiconductor element, and a wiring layer formed on the upper surface of the upper substrate and electrically connected to the semiconductor element. In related art of such a power module structure, Japanese Laid-Open Patent Publication No. 2018-120902 discloses a power electronic circuit package.

SUMMARY

In the semiconductor device, when the semiconductor element and the encapsulation resin greatly differ in coefficient of thermal expansion (CTE), the great difference in coefficient of thermal expansion produces stress on the upper substrate. As a result, cracks may be formed in the wiring layer disposed on the upper surface of the upper substrate.

An embodiment of a semiconductor device includes a lower substrate, a semiconductor element mounted on an upper surface of the lower substrate, an upper substrate disposed on an upper surface of the semiconductor element, an encapsulation resin disposed between the lower substrate and the upper substrate and encapsulating the semiconductor element, a wiring layer disposed on an upper surface of the upper substrate, and a covering resin formed from a material having a coefficient of thermal expansion similar to a coefficient of thermal expansion of the encapsulation resin. The covering resin is disposed on the upper surface of the upper substrate and covers a side surface of the wiring layer.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view illustrating an embodiment of a semiconductor device (cross-sectional view taken along line 1-1 in FIGS. 2 and 3);

FIG. 1B is a partial enlarged cross-sectional view of the semiconductor device illustrated in FIG. 1A;

FIGS. 6A, 6B, 7A, and 7B are schematic cross-sectional views illustrating a method for manufacturing the semiconductor device illustrated in FIG. 1A;

DESCRIPTION OF THE EMBODIMENTS

Figure 2:
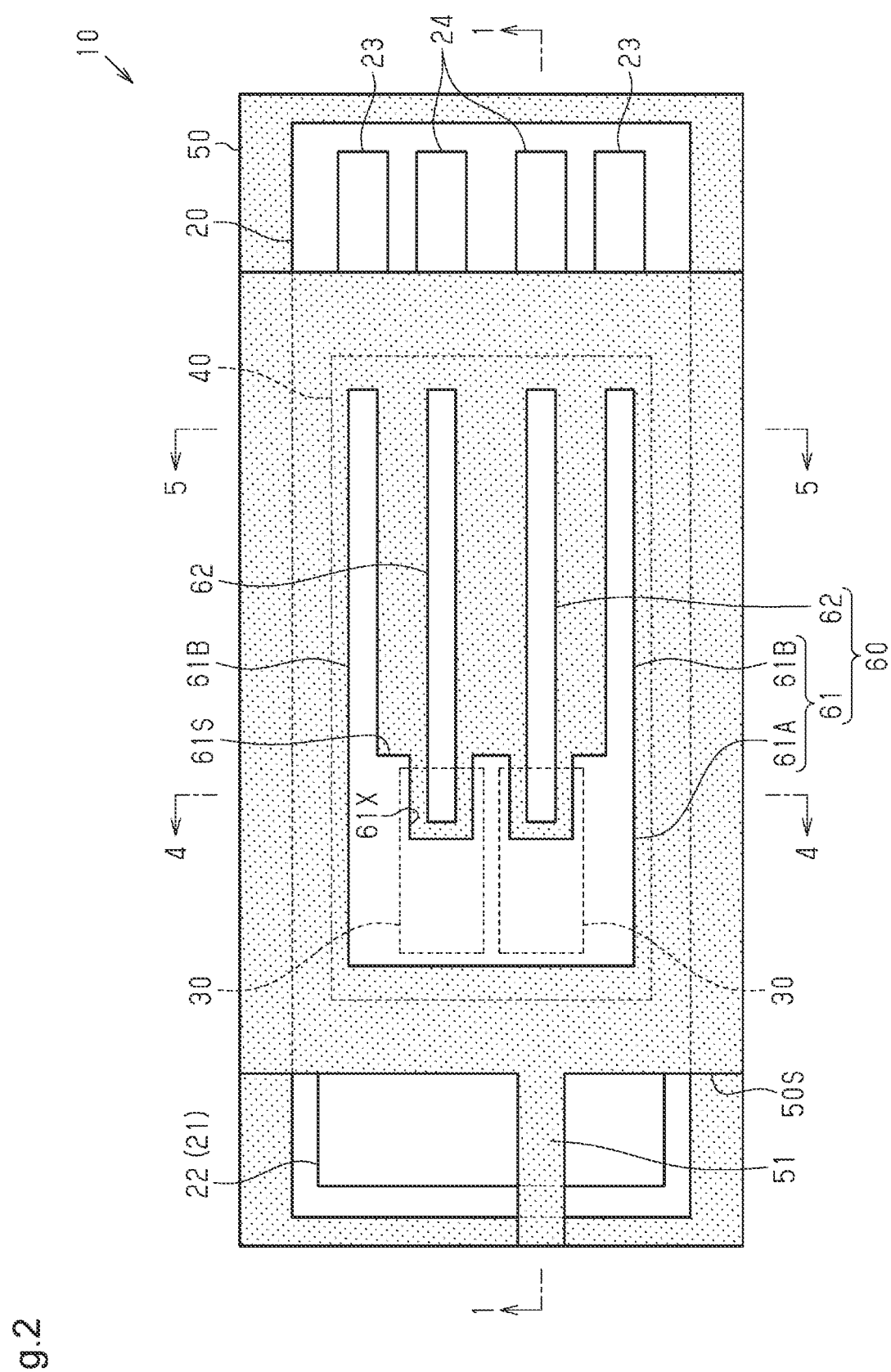
FIGS. 2 and 3 are schematic plan views of the semiconductor device illustrated in FIG. 1A.

Various embodiments will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings. In this specification, "plan view" refers to a view of a subject taken in a vertical direction, for example, in FIG. 1A, and "planar shape" refers to a shape of a subject as viewed in a vertical direction, for example, in FIG. 1A.

A semiconductor device 10 will now be described with reference to FIG. 1A.

The semiconductor device 10 is, for example, a power semiconductor device (power module) that controls and supplies power. An example of the semiconductor device 10 is a DC-DC converter. The semiconductor device 10 includes a lower substrate 20, one or more semiconductor elements 30 (for example, two, refer to FIGS. 2 and 3) mounted on the upper surface of the lower substrate 20, and an upper substrate 40 disposed on the upper surfaces of the semiconductor elements 30. The semiconductor device 10 includes an encapsulation resin 50 disposed between the lower substrate 20 and the upper substrate 40 to encapsulate the semiconductor elements 30 and a wiring layer 60 electrically connected to the semiconductor elements 30 and disposed on the upper surface of the upper substrate 40. The semiconductor elements 30 are disposed between the upper surface of the lower substrate 20 and the lower surface of the upper substrate 40. The semiconductor device 10 incorporates the semiconductor elements 30 between the lower substrate 20 and the upper substrate 40.

The semiconductor device 10 further includes a covering resin disposed on the upper surface of the upper substrate 40 to cover a side surface of the wiring layer 60. In the present embodiment, the covering resin is part of the encapsulation resin 50 and is formed of the same resin material as that of the encapsulation resin 50. In other words, the encapsulation resin 50 include the covering resin. However, the covering resin and the encapsulation resin 50 may be formed from different resin materials. The covering resin may be formed from a material having a coefficient of thermal expansion similar to that of the encapsulation resin 50.

In this specification, "similar" as in "coefficient of thermal expansion similar" means that the difference in coefficient of thermal expansion between the encapsulation resin 50 and the covering resin is included in a range that is less than or equal to 10 ppm/° C. Thus, the covering resin may be part of the encapsulation resin 50. For example, the coefficient of thermal expansion of the encapsulation resin 50 may be approximately 5 ppm/° C. to 18 ppm/° C., and the coefficient of thermal expansion of the covering resin may be approximately 5 ppm/° C. to 28 ppm/° C. For example, the coefficient of thermal expansion of the covering resin is set so that the difference in coefficient of thermal expansion between the covering resin and the encapsulation resin 50 is less than the difference in coefficient of thermal expansion between the covering resin and the semiconductor elements 30. For example, the coefficient of thermal expansion of the covering resin is set so that the difference in coefficient of thermal expansion between the covering resin and the encapsulation resin 50 is less than the difference in coefficient of thermal expansion between the covering resin and the upper substrate 40.

Each semiconductor element 30 is formed from, for example, silicon (Si) or silicon carbide (SiC). The semiconductor element 30 is, for example, a power semiconductor element. For example, an insulated gate bipolar transistor (IGBT), a metal-oxide-semiconductor field-effect transistor (MOSFET), or a diode may be used as the semiconductor element 30. In the present embodiment, the semiconductor element 30 is a MOSFET. The semiconductor element 30 may have any planar shape and any size. The planar shape of the semiconductor element 30 is, for example, rectangular. The thickness of the semiconductor element 30 may be, for example, approximately 50 μm to 600 μm. The coefficient of thermal expansion of the semiconductor element 30 may be, for example, approximately 3 ppm/° C. to 6 ppm/° C.

The semiconductor element 30 includes, for example, electrode pads 31, 32, and 33. The electrode pad 31 is formed, for example, on the lower surface of the semiconductor element 30. For example, the electrode pad 31 covers the entire lower surface of the semiconductor element 30. The electrode pads 32 and 33 are formed, for example, on the upper surface of the semiconductor element 30. The electrode pads 32 and 33 are separately disposed on the upper surface of the semiconductor elements 30. The electrode pad 31 is, for example, a drain electrode of the MOSFET. The electrode pad 32 is, for example, a source electrode of the MOSFET. The electrode pad 33 is, for example, a gate electrode of the MOSFET.

The material of the electrode pads 31, 32, and 33 may be, for example, a metal such as aluminum (Al) or copper (Cu) or an alloy including at least one of these metals. A surface-processed layer may be formed on surfaces of the electrode pads 31, 32, and 33 where appropriate. Examples of the surface-processed layer include a gold (Au) layer, a nickel (Ni) layer/Au layer (metal layer in which Ni layer is used as bottom layer, and Au layer is formed on Ni layer), and a Ni layer/palladium (Pd) layer/Au layer (metal layer in which the Ni layer is used as bottom layer, and the Ni layer, Pd layer, and Au layer are sequentially stacked). Each of the Au layer, the Ni layer, and the Pd layer may be, for example, an electroless plated metal layer formed through an electroless plating process. The Au layer is a metal layer formed from Au or an Au alloy. The Ni layer is a metal layer formed from Ni or a Ni alloy. The Pd layer is a metal layer formed from Pd or a Pd alloy.

The lower substrate 20 is plate-shaped. The lower substrate 20 is, for example, a ceramic substrate formed from a ceramic material such as an oxide ceramic and a non-oxide ceramic. Examples of oxide ceramics include an aluminum oxide ($Al_2O_3$) and zirconia ($ZrO_2$). Examples of non-oxide ceramics include aluminum nitride (AlN) and silicon nitride ($Si_3N_4$). The coefficient of thermal expansion of the lower substrate 20 may be, for example, approximately 2 ppm/° C. to 7 ppm/° C.

The lower substrate 20 may have any planar shape and any size. For example, the planar shape of the lower substrate 20 is rectangular. The thickness of the lower substrate 20 may be, for example, approximately 200 μm to 400 μm.

Figure 3:
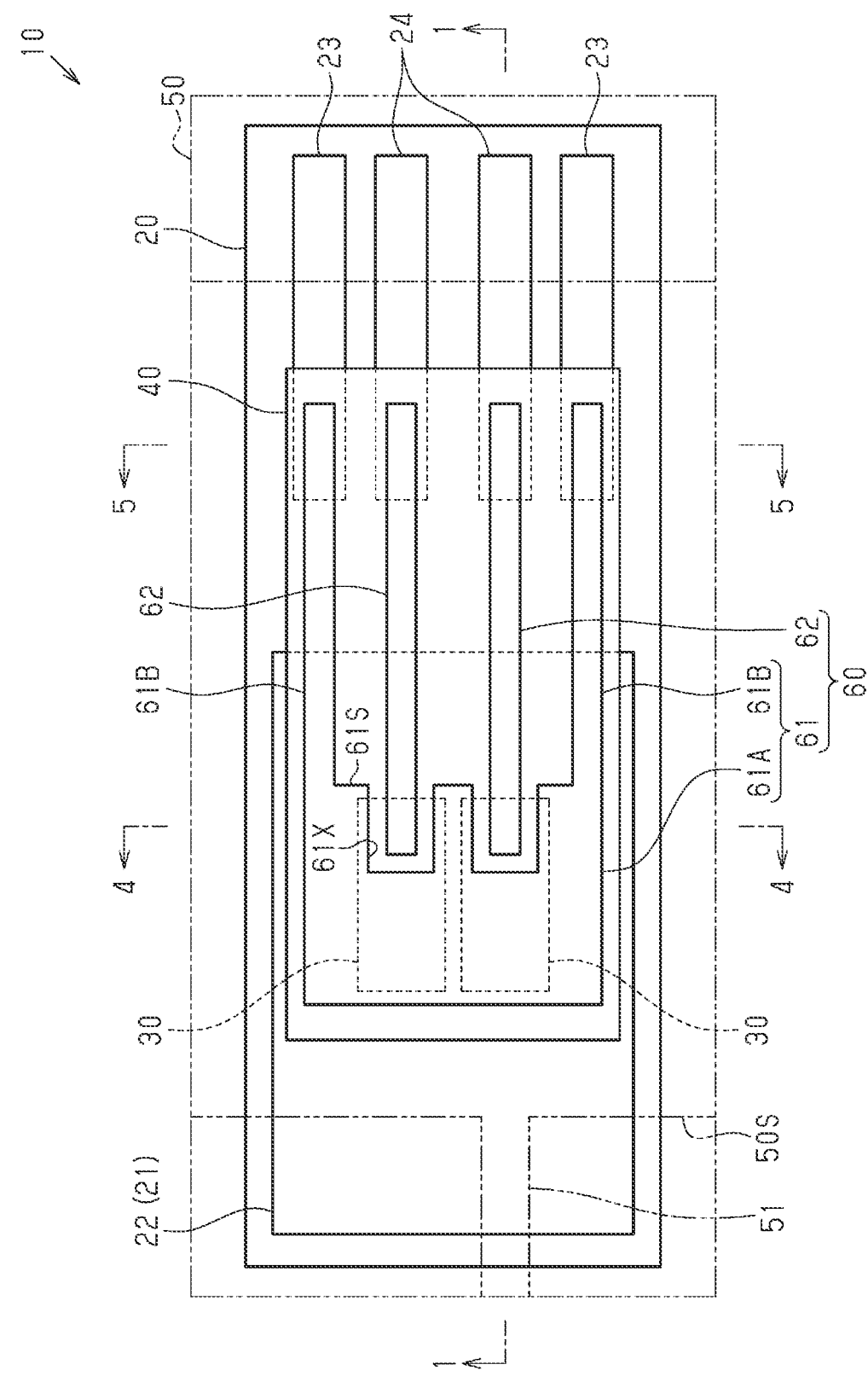

As illustrated in FIGS. 2 and 3, for example, a wiring layer 21 is formed on the upper surface of the lower substrate 20. The wiring layer 21 includes, for example, one or more (for example, one) wiring pattern 22, one or more (for example, two) wiring patterns 23, and one or more (for example, two) wiring patterns 24. FIGS. 2 and 3 are plan views of the semiconductor device 10 illustrated in FIG. 1A taken from above. In FIG. 3, the encapsulation resin 50 is transparent.

The material of the wiring patterns 22, 23, and 24 may be, for example, copper or a copper alloy. A surface-processed layer may be formed on surfaces (upper and side surfaces or only an upper surface) of the wiring patterns 22, 23, and 24 where appropriate. Examples of surface-processed layers include a Au layer, a Ni layer/Au layer, and a Ni layer/Pd layer/Au layer. The coefficient of thermal expansion of the wiring layer 21 may be, for example, approximately 15 ppm/° C. to 18 ppm/° C. The thickness of each of the wiring patterns 22, 23, and 24 may be, for example, approximately 100 μm to 400 μm.

As illustrated in FIG. 3, the wiring patterns 22, 23, and 24 are separately disposed on the upper surface of the lower substrate 20. The wiring patterns 22, 23, and 24 may have any planar shape and any size.

The planar shape of the wiring pattern 22 is, for example, rectangular. The planar shape of the wiring pattern 22 is, for example, larger than the planar shape of each of the wiring patterns 23 and 24. The wiring pattern 22 is, for example, formed in a solid manner That is, the wiring pattern 22 may be a rectangular solid pattern. For example, the wiring pattern 22 entirely extends in a generally one-half (left half in FIG. 3) region of the upper surface of the lower substrate 20. For example, a portion of the wiring pattern 22 overlaps the upper substrate 40 in plan view. The wiring pattern 22 is, for example, electrically connected to the electrode pad 31 of each semiconductor element 30 (refer to FIGS. 1A and 1B).

The planar shape of each wiring pattern 23 is, for example, rectangular. The wiring pattern 23, for example, has a given width in a first direction and extends like a belt in a second direction. The first direction refers to a direction in which the wiring patterns 23 and 24 are arranged in plan view. In FIG. 3, the first direction is the vertical direction in plan view. The second direction refers to a direction orthogonal to the first direction in plan view. In FIG. 3, the second direction is the sideward direction in plan view. For example, the two wiring patterns 23 are disposed closer to the peripheral edges of the lower substrate 20 than the wiring patterns 24, in the first direction. For example, the two wiring patterns 24 are sandwiched between the two wiring patterns 23 in the first direction. For example, a portion of each wiring pattern 23 overlaps the upper substrate 40 in plan view. The wiring pattern 23 is, for example, electrically connected to the electrode pad 32 of the semiconductor element 30 (refer to FIGS. 1A and 1B).

In this specification, the frame of reference for "the vertical direction" and "the sideward direction" is where each drawing sheet is positioned so that the reference characters are properly read.

The planar shape of each wiring pattern 24 is, for example, rectangular. The wiring pattern 24, for example, has a given width in the first direction (vertical direction in FIG. 3) and extends like a belt in the second direction (sideward direction in FIG. 3). For example, the wiring patterns 24 extend parallel to the wiring patterns 23. For example, the two wiring patterns 24 are disposed between the two wiring patterns 23 in the first direction. For example, a portion of each wiring pattern 24 overlaps the upper substrate 40 in plan view. The wiring pattern 24 is, for example, electrically connected to the electrode pad 33 of the semiconductor element 30 (refer to FIGS. 1A and 1B).

As illustrated in FIG. 1A, for example, a metal layer 26 is formed on the lower surface of the lower substrate 20. The metal layer 26 may have any planar shape and any size. The planar shape of the metal layer 26 is, for example, rectangular. The metal layer 26 is, for example, formed in a solid manner. That is, the metal layer 26 may be a rectangular solid pattern. For example, the metal layer 26 extends on the entire lower surface excluding the peripheral edges of the lower surface of the lower substrate 20. The metal layer 26 is used as, for example, a reinforcement layer that restrains warping of the lower substrate 20. The metal layer 26 may also be used as, for example, a heat dissipation member.

The material of the metal layer 26 may be, for example, copper or a copper alloy. A surface-processed layer may be formed on a surface (lower and side surfaces or only the lower surface) of the metal layer 26 where appropriate. Examples of surface-processed layers include a Au layer, a Ni layer/Au layer, and a Ni layer/Pd layer/Au layer. The thickness of the metal layer 26 may be, for example, approximately 100 µm to 400 µm. The thickness of the metal layer 26 may be, for example, less than the thickness of the wiring layer 21.

Each semiconductor element 30 is bonded to the upper surface of the wiring pattern 22 via a bonding portion 71 having an electrical conductivity. The bonding portion 71 is bonded to the wiring pattern 22 and the electrode pad 31 of the semiconductor element 30. The bonding portion 71 electrically connects the wiring pattern 22 and the electrode pad 31.

Figure 4:
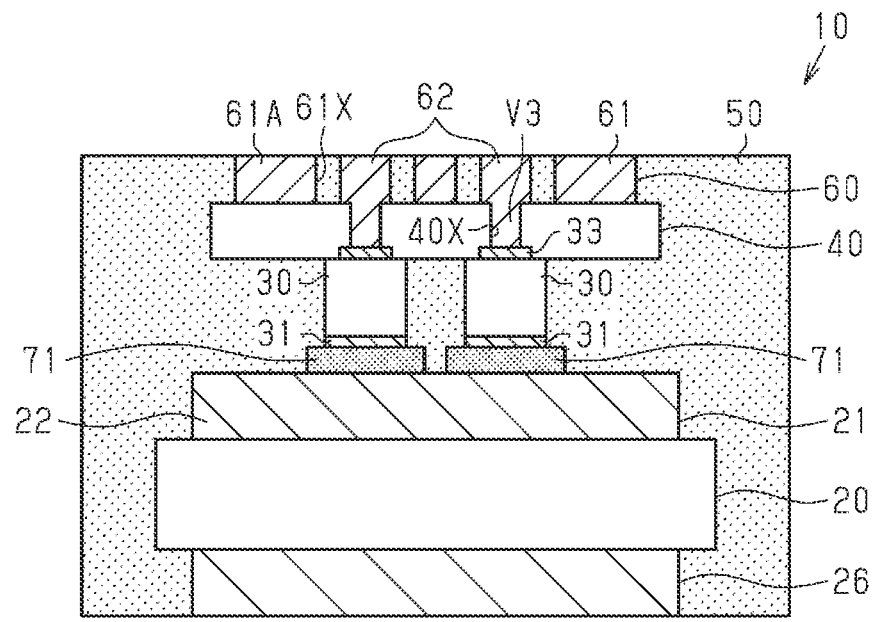
FIG. 4 is a cross-sectional view taken along line 4-4 in FIGS. 2 and 3.

As illustrated in FIG. 4, for example, bonding portions 71 are separately arranged for each semiconductor element 30. Thus, the electrode pad 31 of each semiconductor element 30 is bonded and electrically connected to the wiring pattern 22 via the bonding portion 71.

The semiconductor element 30 is bonded to the upper surface of the wiring pattern 22 via the bonding portion 71. The two semiconductor elements 30 are, for example, separated in a planar direction (sideward direction in FIG. 4) that is orthogonal to a stacking direction of the semiconductor device 10 in which the lower substrate 20 and the upper substrate 40 are stacked (vertical direction in FIG. 4). That is, the two semiconductor elements 30 are arranged beside each other in the sideward direction in FIG. 4. The two semiconductor elements 30 have, for example, the same thickness. The two semiconductor elements 30 are, for example, identical in planar shape and size. As illustrated in FIG. 3, for example, the entirety of each semiconductor element 30 overlaps the wiring pattern 22 in plan view. Also, for example, the entirety of the semiconductor element 30 overlaps the upper substrate 40 in plan view.

Figure 5:
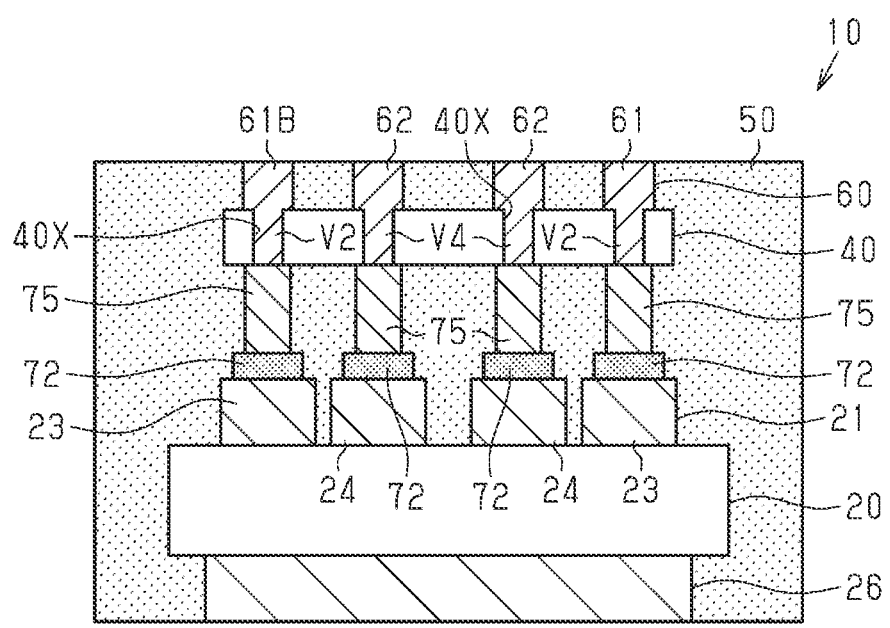
FIG. 5 is a cross-sectional view taken along line 5-5 in FIGS. 2 and 3.

As illustrated in FIG. 5, bonding portions 72 having electrical conductivity are formed on the upper surfaces of the wiring patterns 23 and 24. Connection members 75 are formed on the upper surfaces of the bonding portions 72. Thus, each connection member 75 is bonded and electrically connected to one of the wiring patterns 23 and the wiring patterns 24 via the bonding portion 72.

The material of the bonding portions 71 and 72 may be, for example, a metal sintering material. The sintering material may be, for example, a sintering material having silver (Ag) particles as a main component (silver sintering material) or a sintering material having copper particles as a main component (copper sintering material). The material of the bonding portions 71 and 72 may be, for example, solder, a conductive paste such as a silver paste, or a brazing metal. The thickness of the bonding portions 71 and 72 may be, for example, approximately 20 µm to 60 µm.

The connection members 75 are electrically connected to the wiring layer 60 formed on the upper surface of the upper substrate 40. Thus, the wiring patterns 23 and 24 are electrically connected to the wiring layer 60 via the bonding portions 72 and the connection members 75. The connection members 75 are, for example, rod-shaped and extend in the stacking direction of the semiconductor device 10 (vertical direction in FIG. 5). The connection members 75 are, for example, metal posts. As illustrated in FIG. 1A, for example, the connection member 75 and the semiconductor element 30 have the same thickness. The thickness of the connection member 75 may be, for example, approximately 50 µm to 600 µm. For example, the upper surface of the connection member 75 is flush with the upper surface of the semiconductor element 30. The material of the connection member 75 may be, for example, copper or a copper alloy.

The upper substrate 40 is disposed on the upper surface of the semiconductor element 30 and the upper surface of the connection member 75. The upper substrate 40 is plate-shaped. The upper substrate 40 may have any planar shape and any size. As illustrated in FIG. 3, the planar shape of the upper substrate 40 is, for example, rectangular. The upper substrate 40 is, for example, smaller in planar shape than the lower substrate 20. For example, the dimension of the upper substrate 40 in the sideward direction in FIG. 3 is smaller than the dimension of the lower substrate 20 in the sideward direction in FIG. 3. For example, the dimension of the upper substrate 40 in the vertical direction in FIG. 3 is smaller than the dimension of the lower substrate 20 in the vertical direction in FIG. 3. For example, the entirety of the upper substrate 40 overlaps the lower substrate 20 in plan view.

As illustrated in FIG. 1B, the upper substrate 40 includes, for example, a substrate body 41 and an adhesive layer 42 formed on the lower surface of the substrate body 41. The material of the substrate body 41 may be, for example, an insulative resin such as a polyimide resin or a polyester resin. The adhesive layer 42 may be, for example, an epoxy-based, polyimide-based, or silicone-based adhesive. The coefficient of thermal expansion of the upper substrate 40 may be, for example, approximately 20 ppm/° C. to 25 ppm/° C. The thickness of the substrate body 41 may be, for example, approximately 30 μm to 50 μm. The thickness of the adhesive layer 42 may be, for example, approximately 20 μm to 40 μm.

The substrate body 41 is, for example, adhered to the semiconductor element 30 by the adhesive layer 42. The adhesive layer 42 is adhered to the upper surface of the semiconductor element 30 and the lower surface of the substrate body 41. For example, the adhesive layer 42 incorporates a portion of the semiconductor element 30. In other words, a portion of the semiconductor element 30 is embedded in the adhesive layer 42. For example, the electrode pads 32 and 33 of the semiconductor element 30 are embedded in the adhesive layer 42. For example, an upper portion (portion including the upper surface) of the semiconductor element 30 is embedded in the adhesive layer 42. The adhesive layer 42 covers, for example, a side surface of the upper portion of the semiconductor element 30.

The upper substrate 40 has through holes 40X extending through the upper substrate 40 in the thickness-wise direction. The through holes 40X extend through, for example, the substrate body 41 and the adhesive layer 42 in the thickness-wise direction. As illustrated in FIGS. 1A, 4, and 5, for example, the upper substrate 40 has through holes 40X partially exposing the upper surface of each electrode pad 32, through holes 40X partially exposing the upper surface of each electrode pad 33, and through holes 40X partially exposing the upper surface of each connection member 75.

The wiring layer 60 is formed on the upper surface of the upper substrate 40. As illustrated in FIGS. 2 and 3, the wiring layer 60 includes one or more (for example, one) wiring pattern 61 and one or more (for example, two) wiring patterns 62.

The material of the wiring patterns 61 and 62 may be, for example, copper or a copper alloy. A surface-processed layer may be formed on surfaces (upper and side surfaces or only upper surface) of the wiring patterns 61 and 62 where appropriate. Examples of surface-processed layers include a Au layer, a Ni layer/Au layer, and a Ni layer/Pd layer/Au layer. The coefficient of thermal expansion of the wiring layer 60 may be, for example, approximately 15 ppm/° C. to 18 ppm/° C. The thickness of the wiring patterns 61 and 62 may be, for example, approximately 50 μm to 200 μm.

As illustrated in FIGS. 2 and 3, the wiring patterns 61 and 62 are separately disposed on the upper surface of the upper substrate 40. The wiring patterns 61 and 62 may have any planar shape and any size.

The wiring pattern 61 includes, for example, a main body 61A and two extensions 61B extending from the main body 61A in a planar direction. The planar shape of the main body 61A is, for example, rectangular. The main body 61A overlaps, for example, the semiconductor elements 30 in plan view. For example, the main body 61A partially overlaps the electrode pads 32 of the semiconductor elements 30 (refer to FIG. 1A) in plan view.

As illustrated in FIG. 1B, via wirings V1 are formed in the through holes 40X partially exposing the upper surfaces of the electrode pads 32. The main body 61A of the wiring pattern 61 is, for example, electrically connected to the electrode pads 32 via the via wirings V1. The wiring pattern 61 is, for example, formed integrally with the via wirings V1. For example, the via wirings V1 are separately arranged in the planar direction (sideward direction in FIG. 1B). The via wirings V1, for example, fill the through holes 40X. The via wirings V1 extend through the substrate body 41 and the adhesive layer 42 of the upper substrate 40 in the thickness-wise direction.

As illustrated in FIG. 3, the main body 61A includes a side surface 61S facing the wiring patterns 62. One or more (for example, two) recesses 61X are formed in the side surface 61S. The recesses 61X extend from the side surface 61S to the inside of the main body 61A. The recesses 61X are, for example, disposed in portions of the main body 61A that overlap the electrode pads 33 of the semiconductor elements 30 (refer to FIG. 4) in plan view.

The extensions 61B, for example, extend from the side surface 61S of the main body 61A toward the wiring patterns 23 in plan view. For example, the extensions 61B are formed on opposite ends of the main body 61A in the first direction (vertical direction in FIG. 3) and extend in the second direction (sideward direction in FIG. 3). Each extension 61B has a distal end that, for example, overlaps the wiring pattern 23 in plan view. The planar shape of the extension 61B is, for example, rectangular. The extension 61B, for example, has a given width in the first direction (vertical direction in FIG. 3) and extends like a belt in the second direction (sideward direction in FIG. 3).

As illustrated in FIG. 5, via wirings V2 are formed in the through holes 40X partially exposing the upper surfaces of the connection members 75. The extensions 61B of the wiring pattern 61 are, for example, electrically connected to the connection members 75 via the via wirings V2. The wiring pattern 61 is, for example, formed integrally with the via wirings V2. The via wirings V2, for example, fill the through holes 40X. The wiring pattern 61 is electrically connected to the wiring patterns 23 via the via wirings V2, the connection members 75, and the bonding portions 72. Thus, the wiring patterns 23 are electrically connected to the electrode pads 32 (source electrodes) of the semiconductor elements 30 via the bonding portions 72, the connection members 75, the via wirings V2, the wiring pattern 61, and the via wirings V1 illustrated in FIG. 1B.

As illustrated in FIG. 3, the planar shape of each wiring pattern 62 is, for example, rectangular. The wiring pattern 62, for example, has a given width in the first direction (vertical direction in FIG. 3) and extends like a belt in the second direction (sideward direction in FIG. 3). The two wiring patterns 62 are separated from each other in the first direction and extend, for example, parallel to the extensions 61B of the wiring pattern 61. The two wiring patterns 62 are disposed between the two extensions 61B of the wiring pattern 61 in plan view. Each wiring pattern 62 has a first end (left end in FIG. 3). For example, the first end is disposed in the recess 61X of the main body 61A in plan view. The first end of the wiring pattern 62 is disposed at a position where the first end overlaps the electrode pad 33 of the semiconductor element 30, which is illustrated in FIG. 1A, in plan view.

As illustrated in FIG. 1A, via wirings V3 are formed in the through holes 40X partially exposing the upper surfaces of the electrode pads 33. The first ends of the wiring patterns 62 are, for example, electrically connected to the electrode pads 33 via the via wirings V3. The wiring patterns 62 are, for example, formed integrally with the respective via wirings V3. The via wirings V3, for example, fill the through holes 40X.

As illustrated in FIG. 3, each wiring pattern 62 has a second end (right end in FIG. 3) located at a side opposite from the first end. For example, the second end is disposed at a position where the second end overlaps the wiring pattern 24 in plan view.

As illustrated in FIG. 5, via wirings V4 are formed in the through holes 40X partially exposing the upper surfaces of the connection members 75. The second ends of the wiring patterns 62 are, for example, electrically connected to the connection members 75 via the via wirings V4. The wiring patterns 62 are, for example, formed integrally with the respective via wirings V4. The via wirings V4, for example, fill the through holes 40X. The wiring patterns 62 are electrically connected to the respective wiring patterns 24 via the via wiring V4, the connection members 75, and the bonding portions 72. Thus, the wiring patterns 24 are electrically connected to the electrode pads 33 (gate electrodes) of the respective semiconductor elements 30 via the bonding portions 72, the connection members 75, the via wirings V4, the wiring patterns 62, and the via wirings V3, which are illustrated in FIG. 1A.

As illustrated in FIG. 1A, the encapsulation resin 50, for example, encapsulates the semiconductor elements 30, the connection members 75, and the bonding portions 71 and 72 disposed between the lower substrate 20 and the upper substrate 40. The encapsulation resin 50, for example, collectively encapsulates the semiconductor elements 30. For example, the encapsulation resin 50 covers the side surfaces of the semiconductor elements 30, the side surfaces of the connection members 75, the upper surfaces of the bonding portions 71 exposed from the semiconductor elements 30, the side surfaces of the bonding portions 71, the upper surfaces of the bonding portions 72 exposed from the connection members 75, and the side surfaces of the bonding portions 72. The encapsulation resin 50, for example, covers the side surface of the wiring layer 21, and the upper surface of the lower substrate 20 exposed from the wiring layer 21 in portions overlapping the upper substrate 40 in plan view.

As illustrated in FIGS. 1A and 2, the encapsulation resin 50, for example, partially covers the wiring layer 21 exposed from the upper substrate 40 in plan view. The encapsulation resin 50, for example, partially exposes the wiring layer 21 exposed from the upper substrate 40 in plan view. The encapsulation resin 50, for example, partially covers the upper surface of the lower substrate 20 exposed from the upper substrate 40 in plan view. As illustrated in FIG. 2, the encapsulation resin 50, for example, partially exposes the upper surface of the lower substrate 20 exposed from the upper substrate 40. The encapsulation resin 50, for example, covers a side surface of the lower substrate 20. The encapsulation resin 50, for example, covers the entirety of the side surfaces of the lower substrate 20. The encapsulation resin 50, for example, covers the side surfaces of the lower substrate 20 continuously around the lower substrate 20. The encapsulation resin 50, for example, surrounds the lower substrate 20 from outside.

As illustrated in FIG. 1A, the encapsulation resin 50, for example, covers the lower surface of the lower substrate 20. The encapsulation resin 50, for example, covers the entire lower surface of the lower substrate 20 exposed form the metal layer 26. The encapsulation resin 50, for example, covers a side surface of the metal layer 26. The encapsulation resin 50, for example, covers the entirety of the side surfaces of the metal layer 26. The encapsulation resin 50, for example, exposes the lower surface of the metal layer 26. The lower surface of the encapsulation resin 50 is, for example, flush with the lower surface of the metal layer 26.

The encapsulation resin 50, for example, covers a side surface of the upper substrate 40. The encapsulation resin 50, for example, covers the entirety of the side surfaces of the upper substrate 40. As illustrated in FIG. 2, the encapsulation resin 50, for example, covers the side surfaces of the upper substrate 40 continuously around the upper substrate 40. The encapsulation resin 50, for example, surrounds the upper substrate 40 from outside.

The encapsulation resin 50, for example, covers the upper surface of the upper substrate 40. The encapsulation resin 50, for example, covers the entire upper surface of the upper substrate 40 exposed from the wiring layer 60. The encapsulation resin 50, for example, covers a side surface of the wiring layer 60. The encapsulation resin 50, for example, covers the entirety of the side surfaces of the wiring layer 60. The encapsulation resin 50 is, for example, in contact with the side surfaces of the wiring layer 60. The encapsulation resin 50, for example, surrounds the wiring patterns 61 and 62. The encapsulation resin 50, for example, fills the recesses 61X in the wiring pattern 61. The encapsulation resin 50, for example, exposes the upper surface of the wiring layer 60. For example, as illustrated in FIG. 1A, the upper surface of the encapsulation resin 50 is flush with the upper surface of the wiring layer 60.

The encapsulation resin 50 includes, for example, a side surface 50S covering the wiring layer 21 exposed from the upper substrate 40 and an extension 51 extending from the side surface 50S in the planar direction (in FIG. 2, sideward direction). The extension 51 covers, for example, the upper surface of the wiring pattern 22 of the wiring layer 21. For example, as illustrated in FIG. 2, the extension 51 extends from the side surface 50S to an outer side surface of the semiconductor device 10. The extension 51 has a given width in the first direction (in FIG. 2, vertical direction) and extends like a belt in the second direction (in FIG. 2, sideward direction).

The material of the encapsulation resin 50 may be, for example, a non-photosensitive insulative resin containing a thermosetting resin as a main component. The material of the encapsulation resin 50 may be, for example, an insulative resin such as an epoxy resin or a polyimide resin, or a resin material obtained by mixing the insulative resin with a filler such as silica or alumina. The encapsulation resin 50 may be, for example, a mold resin. As described above, the coefficient of thermal expansion of the encapsulation resin 50 may be, for example, approximately 5 ppm/° C. to 18 ppm/° C.

As illustrated in FIGS. 1A, 2, and 3, the wiring pattern 22 connected to the electrode pads 31 is drawn out to a position where the wiring pattern 22 is exposed from the encapsulation resin 50 in plan view. Also, the wiring patterns 23 connected to the electrode pads 32 via the wiring pattern 61 are drawn out to positions where the wiring patterns 23 are exposed from the encapsulation resin 50 in plan view. Also, the wiring patterns 24 connected to the electrode pads 33 via the wiring patterns 62 are drawn out to positions where the wiring patterns 24 are exposed from the encapsulation resin 50 in plan view. The wiring patterns 22, 23, and 24, drawn to the outside of the encapsulation resin 50 and exposed from the encapsulation resin 50, are used as test pads. The test pad will contact, for example, a probe pin of an electric property measuring device (not illustrated).

Manufacturing Method of Semiconductor Device 10

A method for manufacturing the semiconductor device 10 will now be described. To facilitate understanding, portions that ultimately become elements of the semiconductor device 10 are indicated by reference characters used to denote the final elements.

Figure 6A:
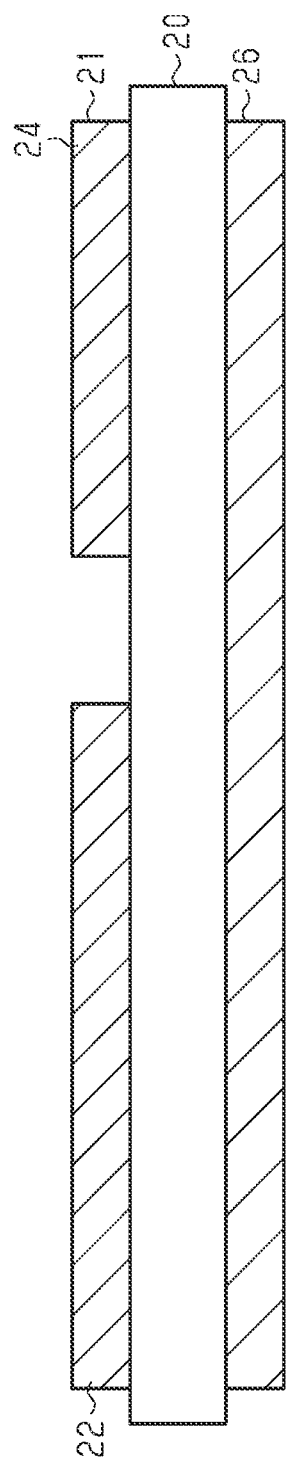

In the step illustrated in FIG. 6A, the lower substrate 20 is prepared. The wiring layer 21 is formed on the upper surface of the lower substrate 20. The metal layer 26 is formed on the lower surface of the lower substrate 20. The wiring layer 21 includes the wiring patterns 22, 23, and 24 (refer to FIG. 3).

Figure 6B:
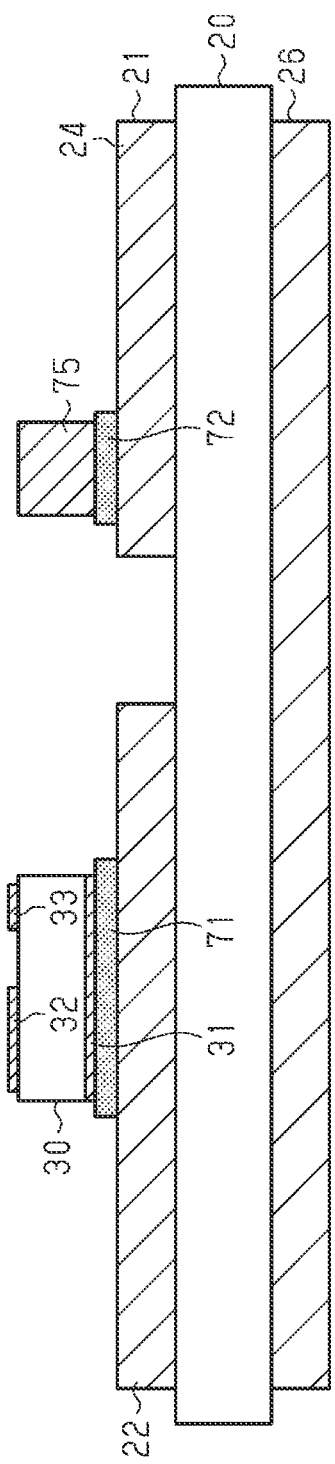

In the step illustrated in FIG. 6B, the bonding portions 71 and 72 are formed on the upper surface of the wiring layer 21. The bonding portions 71 and 72 may be formed, for example, by applying a paste of sintering material (sintering paste) through a printing process or a dispenser process. For example, a silver sintering paste, which is obtained by dispersing silver particles in an organic solvent, may be used as the sintering paste. For example, a screen-printing process or a stencil printing process may be used as the printing process.

Then, the semiconductor element 30 is mounted on the upper surface of the bonding portion 71, and the connection member 75 is mounted on the upper surface of the bonding portion 72. The semiconductor element 30 is mounted on the upper surface of the bonding portion 71 so that the electrode pad 31, which is formed on the lower surface of the semiconductor element 30, contacts the upper surface of the bonding portion 71.

The bonding portions 71 and 72 are heated so that the bonding portions 71 and 72 are sintered. As a result, the wiring pattern 22 of the wiring layer 21 is bonded to the electrode pad 31 of the semiconductor element 30 by the bonding portion 71, and each of the wiring patterns 23 and 24 (refer to FIG. 5) of the wiring layer 21 is bonded to the connection member 75 by the bonding portion 72.

In the step illustrated in FIG. 7A, the upper substrate 40 is mounted on the upper surface of the semiconductor element 30 and the upper surface of the connection member 75. For example, the upper substrate 40 is adhered to the upper surface of the semiconductor element 30 and the upper surface of the connection member 75 by the adhesive layer 42, which is illustrated in FIG. 1B. Instead, for example, the upper surface of the semiconductor element 30 and the upper surface of the connection member 75 may be laminated with a sheet of the upper substrate 40 through thermocompression bonding.

Then, the through holes 40X partially exposing the upper surface of the electrode pad 32 of the semiconductor element 30, the through hole 40X partially exposing the upper surface of the electrode pad 33, and the through hole 40X partially exposing the upper surface of the connection member 75 are formed in given locations of the upper substrate 40. The through holes 40X may be formed, for example, by laser cutting using a $CO_2$ laser or an UV-YAG laser. When the through holes 40X are formed by laser cutting, a desmear process is performed to remove resin smears exposed in the bottom of each through hole 40X (resin smears collected on exposed surfaces of the electrode pads 32 and 33 and an exposed surface of the connection member 75).

The via wirings V1 to V4 (refer to FIGS. 1A, 4, and 5) are formed in the through holes 40X. In addition, the wiring layer 60 is formed on the upper surface of the upper substrate 40 integrally with the via wirings V1 to V4. The wiring layer 60 includes the wiring pattern 61 and the wiring patterns 62. Through the steps, the main body 61A of the wiring pattern 61 is electrically connected to the electrode pad 32 via the via wirings V1, and each extension 61B of the wiring pattern 61 is electrically connected to the connection member 75 via the via wiring V2. Also, the first end of each wiring pattern 62 is electrically connected to the electrode pad 33 via the via wiring V3, and the second end of the wiring pattern 62 is electrically connected to the connection member 75 via the via wiring V4. The via wirings V1 to V4 and the wiring layer 60 may be formed using various wiring forming processes, for example, a semi-additive process.

In the step illustrated in FIG. 7B, the encapsulation resin 50 is formed to encapsulate the semiconductor element 30, the connection member 75, and other components disposed between the lower substrate 20 and the upper substrate 40. Further, the encapsulation resin 50 contacts the side surfaces of the wiring layer 60 and covers the side surfaces. In addition, the encapsulation resin 50, for example, covers the entirety of the upper substrate 40 and the side surfaces and the lower surface of the lower substrate 20. The encapsulation resin 50 may be formed, for example, through a resin molding process. For example, when molds (not illustrated) including a set of an upper mold and a lower mold are used, the structural body illustrated in FIG. 7A is placed in the lower mold, and the structural body is sandwiched between the upper mold and the lower mold. Then, a liquidized thermosetting mold resin is introduced into the molds from a gate (not illustrated) of the molds under pressure (for example, 5 MPa to 10 MPa). Then, the mold resin is heated and cured at a temperature of approximately 180° C. to form the encapsulation resin 50. Although not illustrated in the drawings, the molds include a passage that connects a region where the encapsulation resin 50 is formed to cover the side surfaces of the lower substrate 20 and a region where the encapsulation resin 50 is formed to cover the entirety of the upper substrate 40. When the mold resin is introduced into the passage, the extension 51 is formed in the encapsulation resin 50. When the encapsulation process is completed, the structural body (FIG. 7B) including the encapsulation resin 50 is taken out from the molds. The process for filling the molds with the mold resin includes, for example, a transfer molding, a compression molding, and an injection molding.

The semiconductor device 10 is manufactured through the above manufacturing process. The semiconductor device 10 may be inverted when used or may be arranged at any angle.

Although the semiconductor element 30 is mounted on the bonding portion 71 formed on the wiring layer 21 in the step illustrated in FIG. 6B (thereafter, the upper substrate 40 is mounted on the semiconductor element 30 in the step illustrate in FIG. 7A), the semiconductor element 30 beforehand mounted on the upper substrate 40 may be mounted on the bonding portion 71 formed on the wiring layer 21 in the step illustrate in FIG. 6B.

The semiconductor device 10 has the advantages described below.

(1) The encapsulation resin 50 encapsulates the semiconductor elements 30 disposed between the lower substrate 20 and the upper substrate 40. Thus, the encapsulation resin 50 encapsulates the semiconductor elements 30 located at a lower side of the upper substrate 40. The semiconductor device 10 includes the covering resin disposed on the upper surface of the upper substrate 40. The covering resin covers the side surfaces of the wiring layer 60 at an upper side of the upper substrate 40. The covering resin may be, for example, part of the encapsulation resin 50 as illustrated in FIG. 1A. In this case, the encapsulation resin 50 includes the covering resin. Alternatively, the covering resin may differ from the encapsulation resin 50. In this case, the covering resin is formed from a material having the coefficient of thermal expansion similar to the coefficient of thermal expansion of the encapsulation resin 50. The combination of the encapsulation resin 50 and the encapsulation resin (in the structure illustrated in FIG. 1A, the encapsulation resin 50 including the encapsulation resin) sandwiches the upper substrate 40 from the upper side and the lower side. This mitigates warping of the upper substrate 40 caused by the difference in coefficient of thermal expansion between the encapsulation resin 50 and the semiconductor elements 30. This limits formation of cracks in the wiring layer 60 formed on the upper surface of the upper substrate 40.

(2) The encapsulation resin 50 further covers the side surfaces of the wiring layer 60. Thus, the encapsulation resin 50 physically restricts movement of the wiring layer 60. As a result, warping of the wiring layer 60 is mitigated, and formation of cracks in the wiring layer 60 is appropriately limited.

(3) The encapsulation resin 50 is a single layer including a semiconductor element encapsulation portion that encapsulates the semiconductor elements 30 and a wiring layer covering portion that covers the side surfaces of the wiring layer 60. That is, the semiconductor element encapsulation portion and the wiring layer covering portion are integrally formed by the single encapsulation resin 50. In this structure, the single encapsulation resin 50 sandwiches the upper substrate 40 from the upper side and the lower side. This appropriately mitigates warping of the upper substrate 40 caused by the difference in coefficient of thermal expansion between the encapsulation resin 50 and the semiconductor elements 30. Thus, formation of cracks in the wiring layer 60, which is formed on the upper surface of the upper substrate 40, is appropriately limited.

(4) The encapsulation resin 50 covers the side surfaces of the upper substrate 40. In this structure, the encapsulation resin 50 surrounds the outer periphery of the upper substrate 40. This appropriately mitigates warping of the upper substrate 40 caused by the difference in coefficient of thermal expansion between the encapsulation resin 50 and the semiconductor elements 30. Thus, formation of cracks in the wiring layer 60, which is formed on the upper surface of the upper substrate 40, is appropriately limited.

(5) The encapsulation resin 50 covers the side surfaces and the lower surface of the lower substrate 20. In this structure, the encapsulation resin 50 surrounds the outer periphery of the lower substrate 20. This appropriately limits warping of the lower substrate 20 caused by the difference in coefficient of thermal expansion between the encapsulation resin 50 and the semiconductor elements 30.

It should be apparent to those skilled in the art that the foregoing embodiments may be implemented in many other specific forms without departing from the scope of this disclosure. Particularly, it should be understood that the foregoing embodiments may be implemented in the following forms.

The embodiment may be modified as follows. The embodiment and the modified examples described below may be combined as long as the combined modified examples remain technically consistent with each other.

Figure 8:
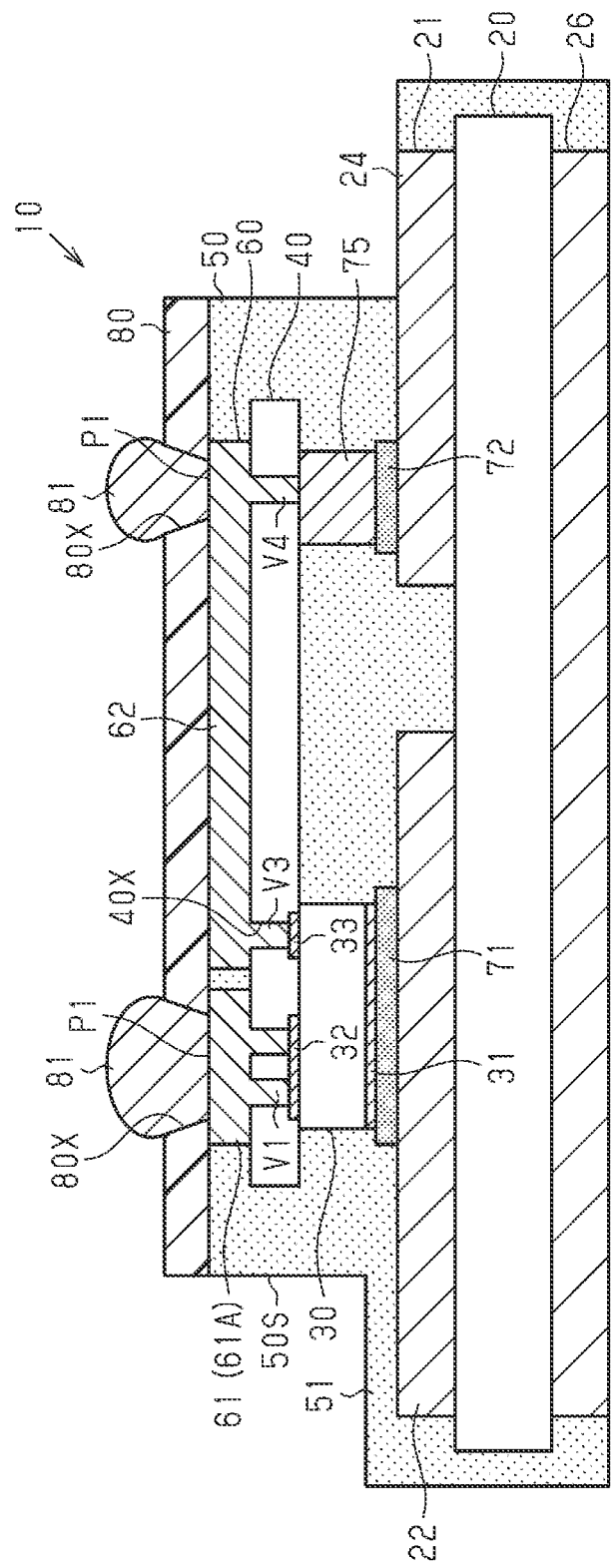
FIG. 8 is a schematic cross-sectional view illustrating a modified example of a semiconductor device.

As illustrated in FIG. 8, a solder resist layer 80 may be formed on the upper surface of the encapsulation resin 50 to cover the upper surface of the wiring layer 60. For example, the upper surface of the wiring layer 60 is flush with the upper surface of the encapsulation resin 50. The solder resist layer 80 covers the upper surface of the wiring layer 60 and the upper surface of the encapsulation resin 50. The solder resist layer 80, for example, includes openings 80X extending through the solder resist layer 80 in the thickness-wise direction to partially expose the upper surface of the wiring layer 60 as external connection pads P1.

In this structure, the solder resist layer 80 is formed on the upper surface of the wiring layer 60 and the upper surface of the encapsulation resin 50, which are flush with each other, so that the thickness of the solder resist layer 80 is uniform.

As illustrated in FIG. 8, external connection terminals 81 may be disposed on the external connection pads P1, that is, the upper surface of the wiring layer 60 may be exposed in the bottom of the openings 80X. When the semiconductor device 10 is mounted on a mount substrate (not illustrated), for example a motherboard, the external connection terminals 81 are electrically connected to pads of the mount substrate. The external connection terminals 81 may be, for example, solder balls or lead pins. In this modified example, solder balls are used as the external connection terminals 81.

Figure 9:
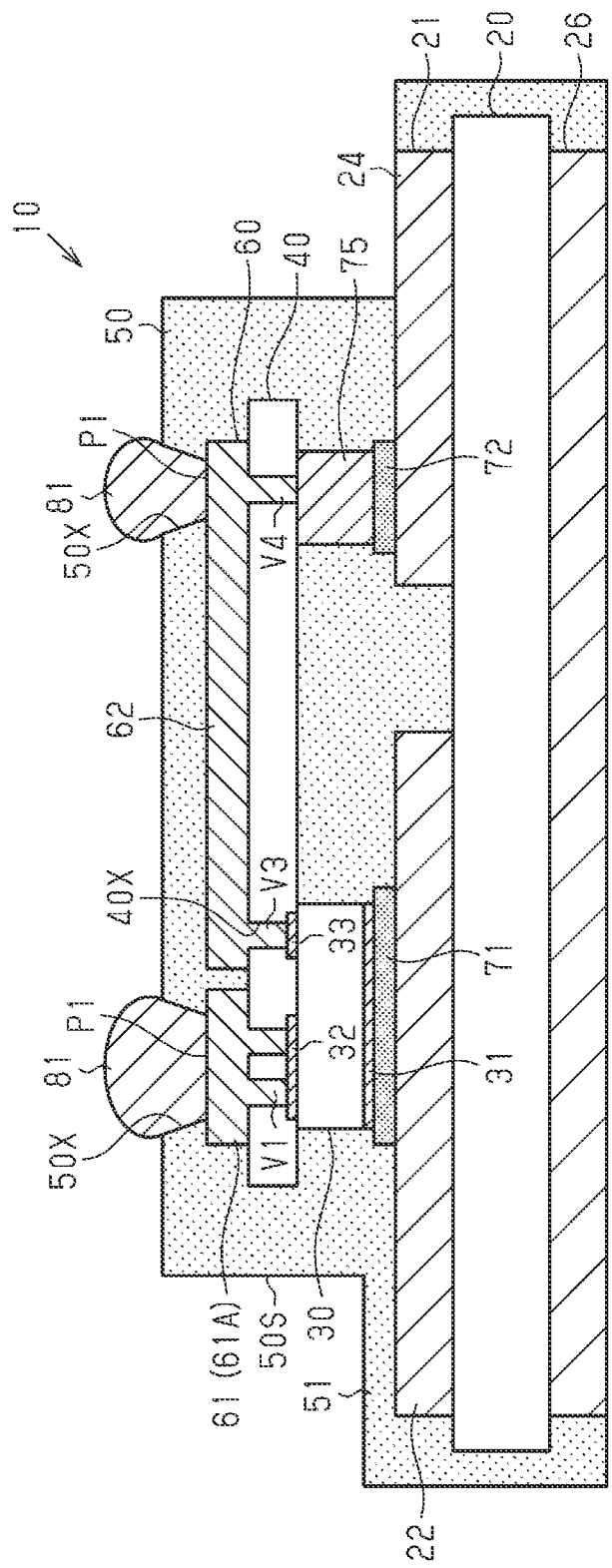
FIG. 9 is a schematic cross-sectional view illustrating a further modified example of a semiconductor device (cross-sectional view taken along line 9-9 in FIG. 10)

As illustrated in FIG. 9, the encapsulation resin 50 may cover the upper surface of the wiring layer 60. In this case, the encapsulation resin 50 may include openings 50X partially exposing the upper surface of the wiring layer 60 as the external connection pads P1. The external connection terminals 81 may be disposed on the external connection pads P1.

Figure 10:
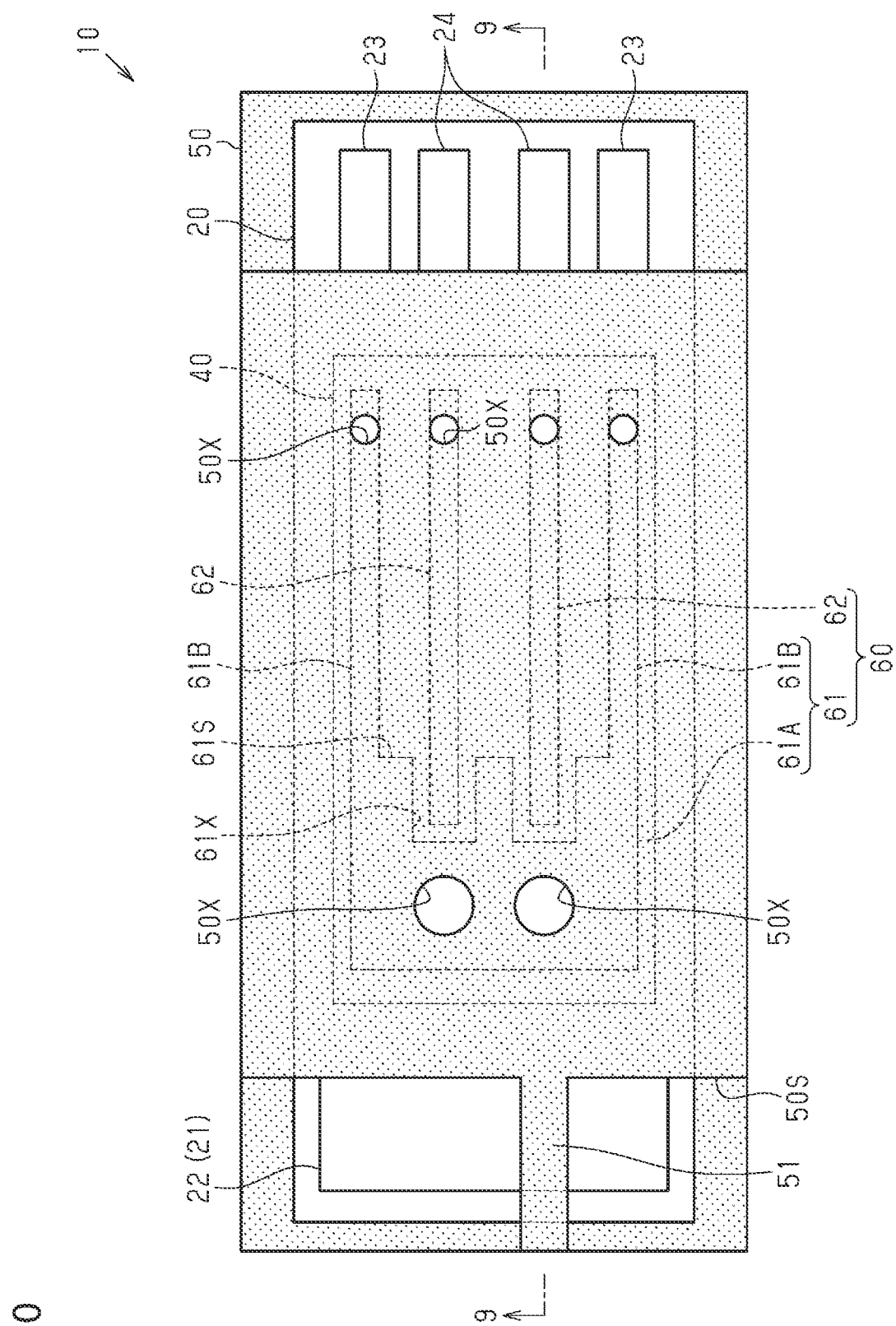
FIG. 10 is a schematic plan view of the semiconductor device illustrated in FIG. 9.

For example, as illustrated in FIG. 10, the encapsulation resin 50 includes openings 50X partially exposing the upper surface of the main body 61A of the wiring pattern 61 and openings 50X partially exposing the upper surface of each extension 61B of the wiring pattern 61. For example, the encapsulation resin 50 further includes openings 50X partially exposing the upper surface of the second end of each wiring pattern 62. Each opening 50X may have any planar shape and any size. The planar shape of the opening 50X is, for example, circular. The openings 80X illustrated in FIG. 8 may also be formed in the same manner as the openings 50X.

In this structure, the openings 50X are formed in the encapsulation resin 50 that covers the upper surface of the wiring layer 60, so that formation of the solder resist layer 80 illustrated in FIG. 8 may be omitted.

Figure 11:
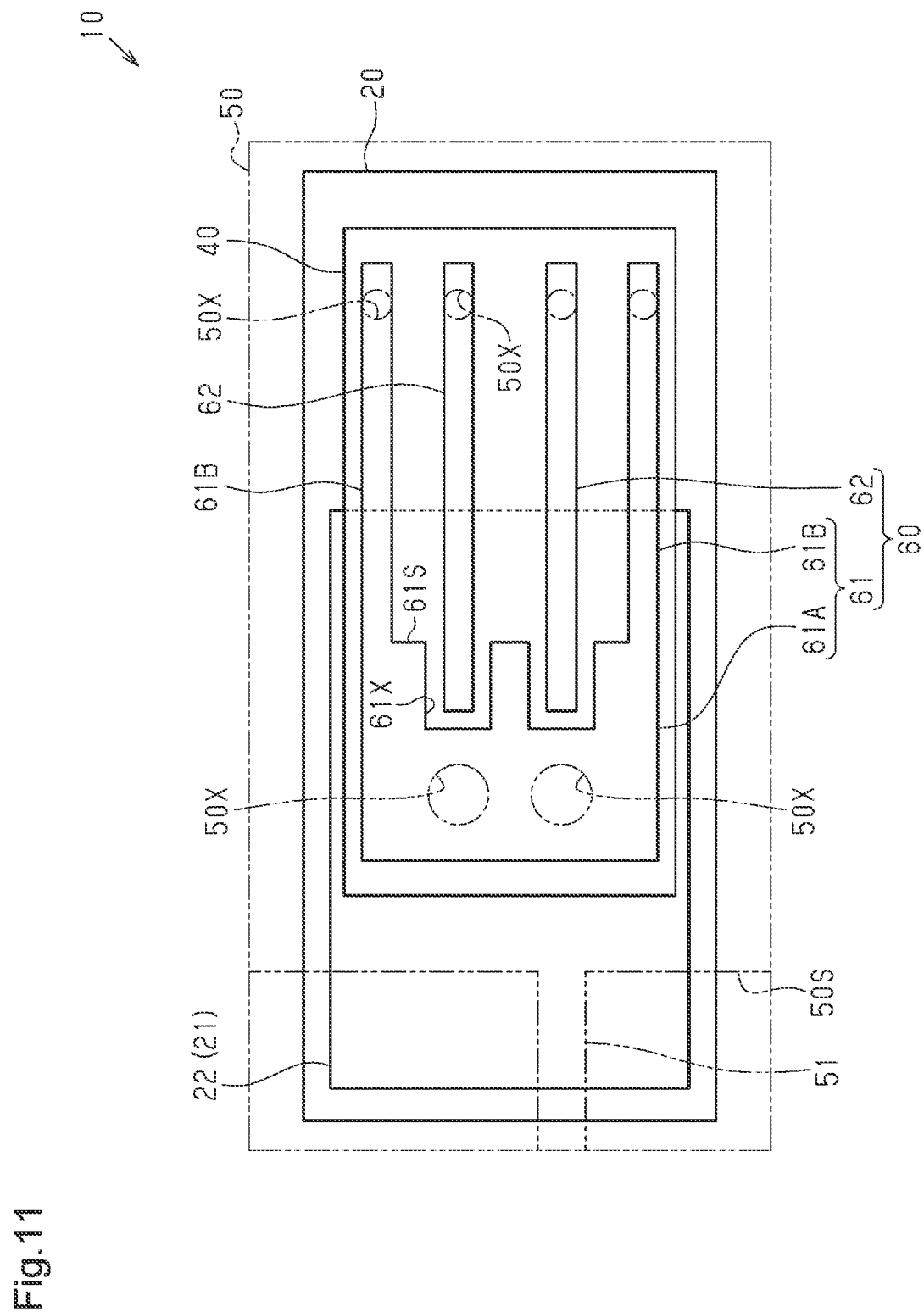
FIG. 11 is a schematic plan view illustrating a further modified example of a semiconductor device.

As illustrated in FIG. 11, the wiring patterns 23 and 24 may be omitted from the upper surface of the lower substrate 20. That is, the wiring patterns 23 and 24 that connect the wiring patterns 61 and 62, which are electrically connected to the electrode pads 32 and 33 (refer to FIG. 1A) of the semiconductor elements 30, to the outside of the encapsulation resin 50 may be omitted. In this case, the connection members 75 illustrated in FIG. 1A are omitted. Also, in this case, for example, the wiring patterns 61 and 62 exposed in the openings 50X may be used as test pads. Alternatively, besides the openings 50X, the encapsulation resin 50 or the solder resist layer 80 (refer to FIG. 8) may have openings that partially expose the upper surfaces of the wiring patterns 61 and 62 as the test pads.

In the embodiment, the wiring pattern 22 does not have to include the portion drawn to the outside of the encapsulation resin 50 and exposed from the encapsulation resin 50 (refer to FIG. 2). In addition, the wiring pattern 22 does not have to include the portion drawn to the outside of the upper substrate 40 in plan view.

In the embodiment, the planar shape of the upper substrate 40 is smaller than the planar shape of the lower substrate 20. Instead, the planar shape of the upper substrate 40 may be, for example, larger than the planar shape of the lower substrate 20.

Figure 12:
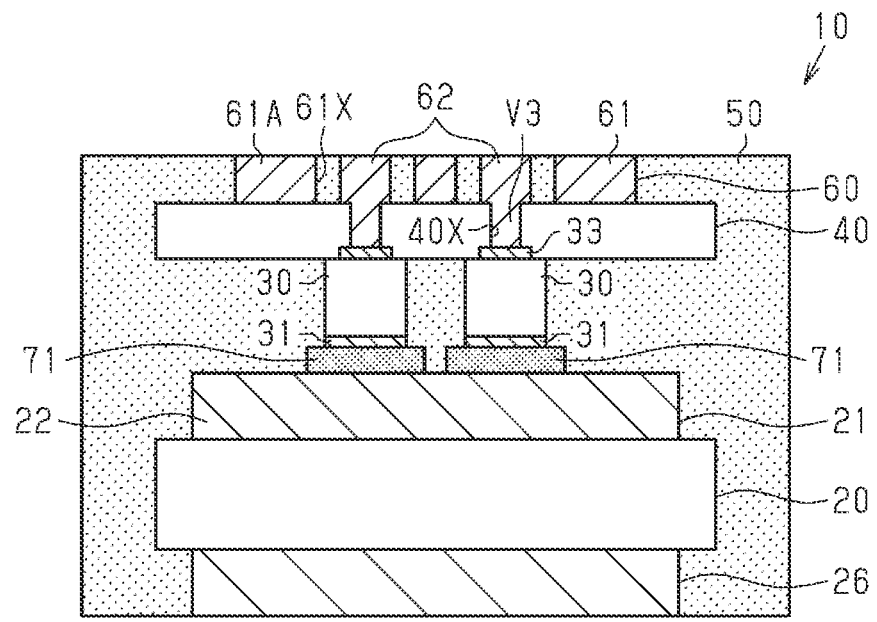
FIG. 12 is a schematic cross-sectional view illustrating a further modified example of a semiconductor device.

Alternatively, for example, as illustrated in FIG. 12, the planar shape of the upper substrate 40 may be identical in size to the planar shape of the lower substrate 20. For example, the upper substrate 40 and the lower substrate 20 may be identical in planar shape and size. In the modified example illustrated in FIG. 12, the entirety of the upper substrate 40 overlaps the lower substrate 20 in plan view.

In the embodiment, the encapsulation resin 50 encapsulates the semiconductor elements 30 disposed between the lower substrate 20 and the upper substrate 40 and covers the side surfaces of the wiring layer 60. That is, the semiconductor element encapsulation portion encapsulating the semiconductor elements 30 and the wiring layer covering portion covering the side surfaces of the wiring layer 60 are integrally formed of the single encapsulation resin 50. However, the encapsulation resin 50 is not limited to this structure.

Figure 13:
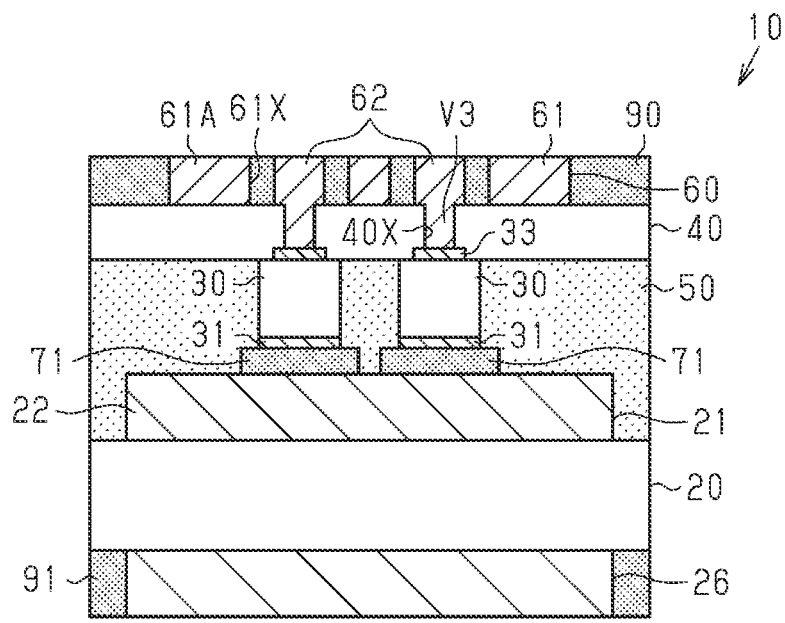
FIG. 13 is a schematic cross-sectional view illustrating a further modified example of a semiconductor device.

For example, as illustrated in FIG. 13, besides the encapsulation resin 50 encapsulating the semiconductor elements 30, a covering resin 90 may be disposed on the upper surface of the upper substrate 40 to cover the side surfaces of the wiring layer 60. That is, the encapsulation resin 50 encapsulating the semiconductor elements 30 and the covering resin 90 covering the side surfaces of the wiring layer 60 may be formed of separate members. The material of the covering resin 90 may have a coefficient of thermal expansion similar to that of the encapsulation resin 50. In this specification, "similar" as in "coefficient of thermal expansion similar" means that the difference in coefficient of thermal expansion between the encapsulation resin 50 and the covering resin 90 is included in a range that is less than or equal to 10 ppm/° C. The coefficient of thermal expansion of the covering resin 90 may be, for example, approximately 5 ppm/° C. to 28 ppm/° C. For example, the coefficient of thermal expansion of the covering resin 90 is set so that the difference in coefficient of thermal expansion between the covering resin 90 and the encapsulation resin 50 is less than the difference in coefficient of thermal expansion between the covering resin 90 and the semiconductor elements 30. For example, the coefficient of thermal expansion of the covering resin 90 is set so that the difference in coefficient of thermal expansion between the covering resin 90 and the encapsulation resin 50 is less than the difference in coefficient of thermal expansion between the covering resin 90 and the upper substrate 40. The material of the covering resin 90 may be, for example, similar to the material of the encapsulation resin 50. For example, the covering resin 90 and the encapsulation resin 50 may be formed from different resin materials or the same resin material. The material of the covering resin 90 may be, for example, a non-photosensitive insulative resin containing a thermosetting resin as a main component. The material of the covering resin 90 may be, for example, an insulative resin such as an epoxy resin or a polyimide resin, or a resin material obtained by mixing the resin with a filler such as silica or alumina. The covering resin 90 may be, for example, a mold resin, an underfill resin, or a potting resin. The covering resin 90 may be formed, for example, through a resin molding process or a potting process.

The covering resin 90 covers the entirety of the side surfaces of the wiring layer 60. The covering resin 90 is in contact with the side surfaces of the wiring layer 60. The covering resin 90 exposes, for example, the upper surface of the wiring layer 60. The upper surface of the covering resin 90 is, for example, flush with the upper surface of the wiring layer 60. The covering resin 90 covers, for example, the entire upper surface of the upper substrate 40 exposed from the wiring layer 60.

In this structure, the upper substrate 40 is sandwiched from the upper side and the lower side by the encapsulation resin 50, which encapsulates the semiconductor elements 30 disposed between the lower substrate 20 and the upper substrate 40, and the covering resin 90, which covers the side surfaces of the wiring layer 60. The covering resin 90 is formed from a material having a coefficient of thermal expansion similar to that of the encapsulation resin 50. Thus, the upper substrate 40 is sandwiched from the upper side and the lower side by the encapsulation resin 50 and the covering resin 90 that are similar in coefficient of thermal expansion. This mitigates warping of the upper substrate 40 caused by the difference in coefficient of thermal expansion between the encapsulation resin 50 and the semiconductor elements 30. This limits formation of cracks in the wiring layer 60, which is formed on the upper surface of the upper substrate 40.

In addition, the encapsulation resin 50 and the covering resin 90 are separate members. This increases the degree of freedom for selecting materials of the encapsulation resin 50 and the covering resin 90. In addition, since the encapsulation resin 50 and the covering resin 90 are separate member, the degree of freedom for shapes of the encapsulation resin 50 and the covering resin 90 is increased.

In the modified example illustrated in FIG. 13, the upper surface of the covering resin 90 is flush with the upper surface of the wiring layer 60. Alternatively, the covering resin 90 may cover the upper surface of the wiring layer 60. In this case, for example, in the same manner as the openings 50X illustrated in FIG. 9, openings may be formed in the covering resin 90 to partially expose the upper surface of the wiring layer 60 as external connection pads. Additionally, in this case, for example, in the same manner as the openings 50X illustrated in FIG. 9, the external connection terminals 81 may be disposed on the upper surface of the wiring layer 60 exposed in the bottom of the openings of the covering resin 90.

Alternatively, the upper surface of the covering resin 90 may be located at a lower position than the upper surface of the wiring layer 60. In this case, the covering resin 90 partially covers the side surfaces of the wiring layer 60 in the stacking direction of the semiconductor device 10 (in FIG. 13, the vertical direction). That is, the covering resin 90 exposes part (upper part) of the side surfaces of the wiring layer 60 in the stacking direction of the semiconductor device 10. This structure also obtains the advantages (1) and (2) of the embodiment.

As illustrated in FIG. 13, besides the encapsulation resin 50 encapsulating the semiconductor elements 30, an insulation resin 91 may be disposed to cover the lower surface of the lower substrate 20. That is, the encapsulation resin 50 encapsulating the semiconductor elements 30 and the insulation resin 91 covering the lower surface of the lower substrate 20 may be formed of separate members. The insulation resin 91 has, for example, a coefficient of thermal expansion similar to that of the encapsulation resin 50. The coefficient of thermal expansion of the insulation resin 91 may be, for example, approximately 5 ppm/° C. to 28 ppm/° C. The material of the insulation resin 91 may be, for example, similar to the material of the covering resin 90. The insulation resin 91 may be formed, for example, through a resin molding process or a potting process.

The insulation resin 91, for example, covers a side surface of the metal layer 26. The insulation resin 91, for example, covers the entirety of the side surfaces of the metal layer 26. The insulation resin 91, for example, exposes the lower surface of the metal layer 26. The lower surface of the insulation resin 91 is, for example, flush with the lower surface of the metal layer 26. The insulation resin 91, for example, covers the entire lower surface of the lower substrate 20 exposed from the metal layer 26.

In the modified example illustrated in FIG. 13, the insulation resin 91 may cover the lower surface of the metal layer 26.

In the embodiment, the encapsulation resin 50 may cover the lower surface of the metal layer 26.

In the modified example illustrated in FIG. 13, the encapsulation resin 50 encapsulating the semiconductor elements 30, the covering resin 90 covering the side surfaces of the wiring layer 60, and the insulation resin 91 covering the lower surface of the lower substrate 20 are formed of separate members. Instead, for example, among the encapsulation resin 50, the covering resin 90, the insulation resin 91, the encapsulation resin 50 and the covering resin 90 may be formed integrally with each other. For example, among the encapsulation resin 50, the covering resin 90, and the insulation resin 91, the encapsulation resin 50 and the insulation resin 91 may be formed integrally with each other.

In the embodiment, the encapsulation resin 50 covers the side surfaces of the lower substrate 20. Instead, for example, as illustrated in FIG. 13, the side surfaces of the lower substrate 20 may be exposed from the encapsulation resin 50. In this case, the side surfaces of the encapsulation resin 50 are, for example, flush with the side surfaces of the lower substrate 20. In the modified example illustrated in FIG. 13, the side surfaces of the insulation resin 91 covering the lower surface of the lower substrate 20 are flush with the side surfaces of the lower substrate 20.

In the modified example illustrated in FIG. 13, the insulation resin 91 may cover a side surface of the lower substrate 20.

In the embodiment, the encapsulation resin 50 covers the side surfaces of the upper substrate 40. Instead, for example, as illustrated in FIG. 13, the side surfaces of the upper substrate 40 may be exposed from the encapsulation resin 50. In this case, the side surfaces of the encapsulation resin 50 are, for example, flush with the side surfaces of the upper substrate 40. In the modified example illustrated in FIG. 13, the side surfaces of the covering resin 90, which is formed on the upper surface of the upper substrate 40, are flush with the side surfaces of the upper substrate 40.

In the modified example illustrated in FIG. 13, the covering resin 90 may cover a side surface of the upper substrate 40.

In the modified example illustrated in FIG. 13, the covering resin 90 covers the entire upper surface of the upper substrate 40 exposed from the wiring layer 60.

Figure 14:
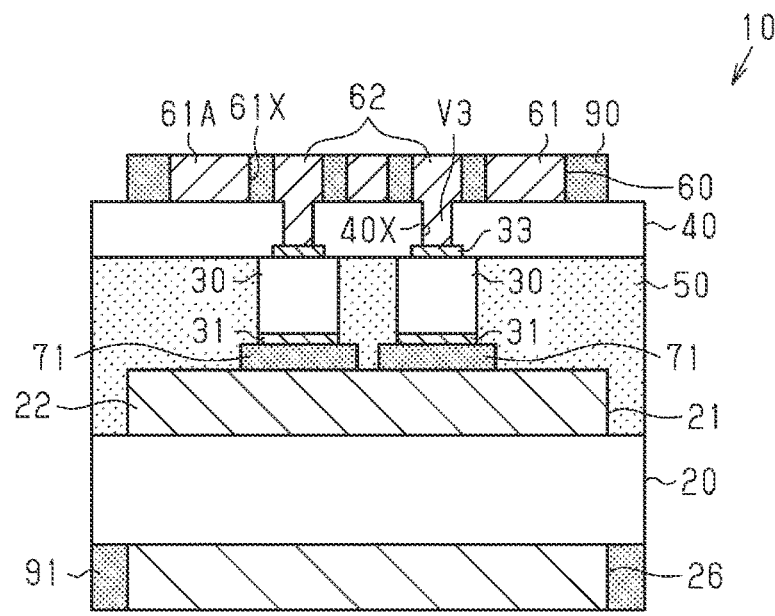
FIG. 14 is a schematic cross-sectional view illustrating a further modified example of a semiconductor device (cross-sectional view taken along line 14-14 in FIG. 15)

Instead, for example, as illustrated in FIG. 14, the covering resin 90 may partially cover the upper surface of the upper substrate 40 exposed from the wiring layer 60. Even in this case, the covering resin 90 is in contact with the side surfaces of the wiring layer 60 and covers the side surfaces of the wiring layer 60.

Figure 15:
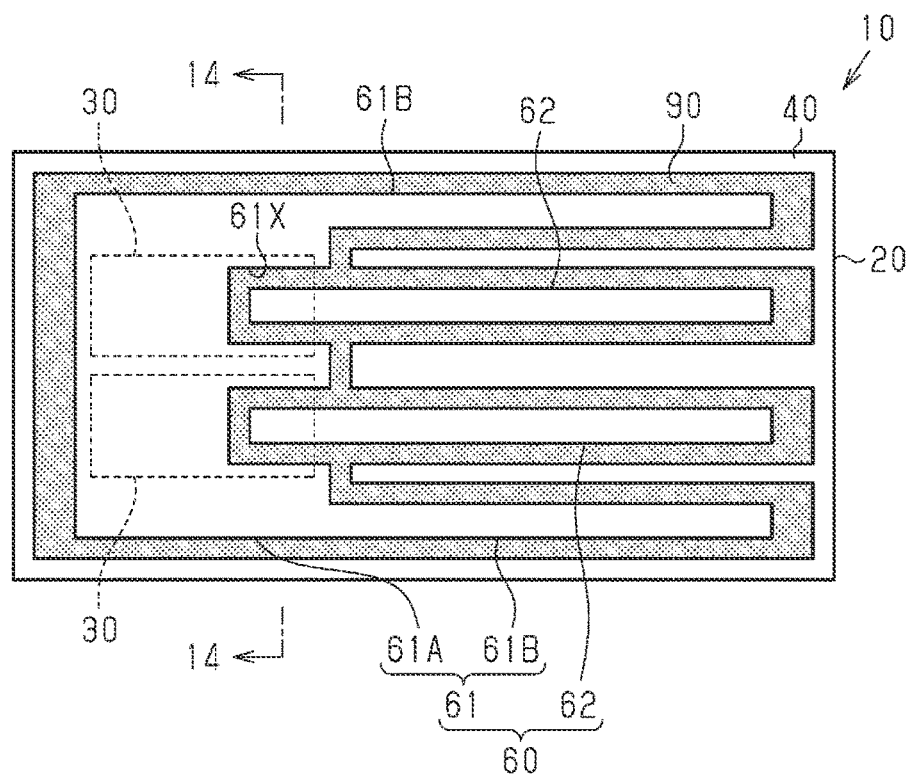
FIG. 15 is a schematic plan view of the semiconductor device illustrated in FIG. 14.

For example, as illustrated in FIG. 15, the covering resin 90 may surround the side surfaces of the wiring patterns 61 and 62 along the outer periphery of each of the wiring patterns 61 and 62. The covering resin 90 partially exposes the upper surface of the upper substrate 40.

This structure obtains the advantages (1) and (2) of the embodiment. This structure also reduces the amount of the covering resin 90, thereby reducing the manufacturing cost of the semiconductor device 10.

Figure 16:
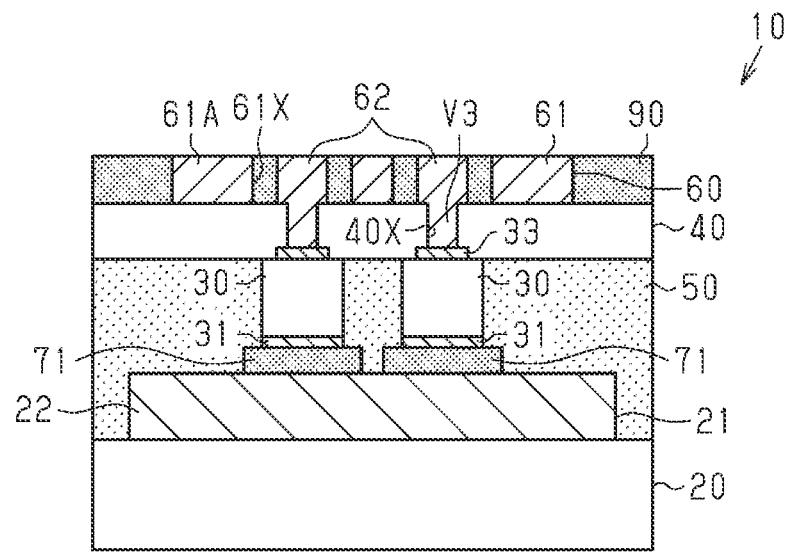
FIG. 16 is a schematic cross-sectional view illustrating a further modified example of a semiconductor device.

As illustrated in FIG. 16, the metal layer 26 may be omitted.

As illustrated in FIG. 16, the insulation resin 91 may be omitted. In the same manner as the encapsulation resin 50 illustrated in FIG. 16, the encapsulation resin 50 of the embodiment may expose the side surfaces and the lower surface of the lower substrate 20.

Figure 17:
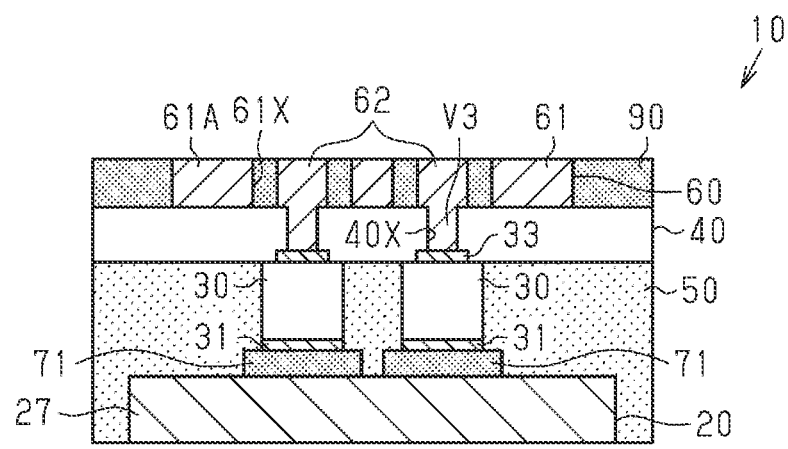
FIG. 17 is a schematic cross-sectional view illustrating a further modified example of a semiconductor device.

As illustrated in FIG. 17, the lower substrate 20 may be formed of a metal plate 27. In this case, the planar shape of the lower substrate 20 may be smaller than the planar shape of the upper substrate 40. Alternatively, the planar shape of the lower substrate 20 may be larger than the planar shape of the upper substrate 40 or may be identical in size to the planar shape of the upper substrate 40. When the lower substrate 20 is formed of the metal plate 27, for example, the semiconductor elements 30 are mounted on the upper surface of the metal plate 27. The material of the metal plate 27 may be, for example, copper or a copper alloy. A surface-processed layer may be formed on a surface of the metal plate 27 where appropriate. Examples of surface-processed layers include a Au layer, a Ni layer/Au layer, and a Ni layer/Pd layer/Au layer. The coefficient of thermal expansion of the metal plate 27 may be, for example, approximately 15 ppm/° C. to 18 ppm/° C.

In this structure, since the lower substrate 20 is formed of the metal plate 27, the entire heat dissipation performance of the semiconductor device 10 is improved.

The metal plate 27 illustrated in FIG. 17 may be used as a wiring or an electrode. That is, the lower substrate 20 may form a wiring or an electrode.

Figure 18:
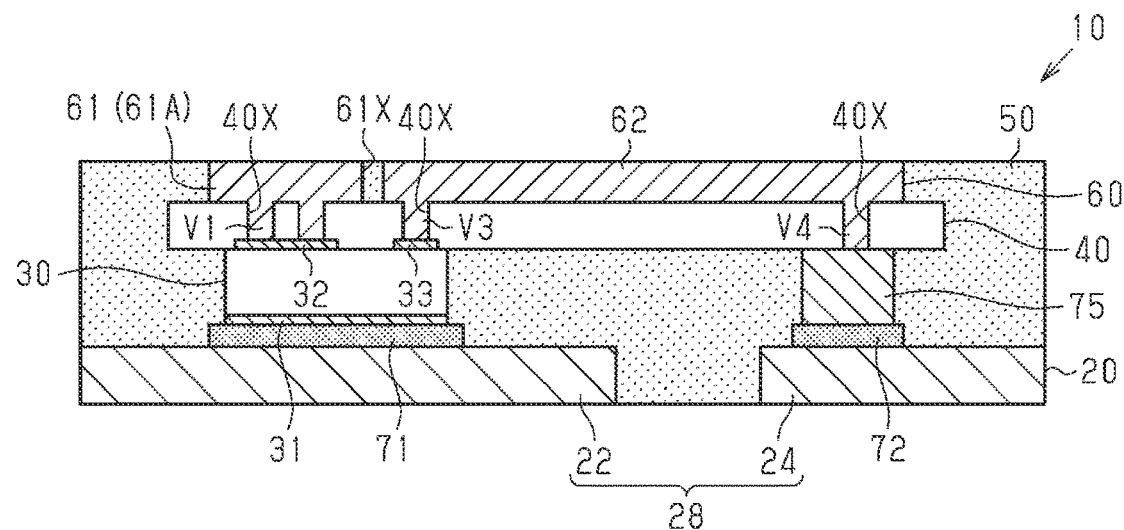
FIG. 18 is a schematic cross-sectional view illustrating a further modified example of a semiconductor device (cross-sectional view taken along line 18-18 in FIG. 19)
Figure 19:
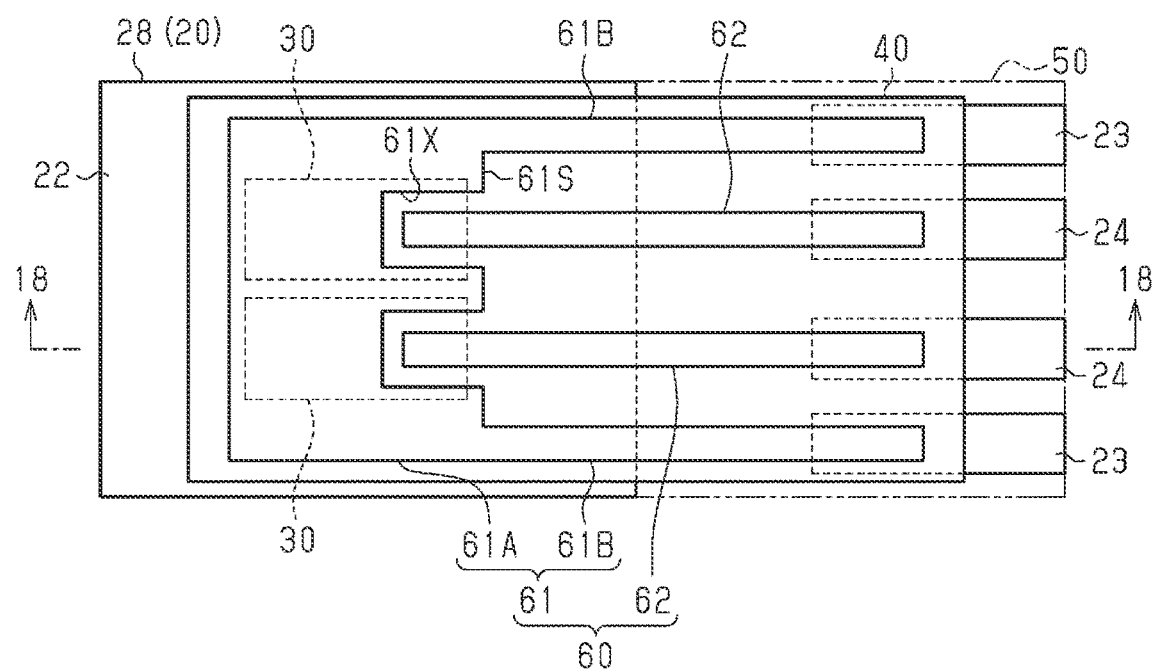
FIG. 19 is a schematic plan view of the semiconductor device illustrated in FIG. 18.

For example, as illustrated in FIGS. 18 and 19, the lower substrate 20 may be formed of a wiring layer 28. In this structure, the wiring layer 28 by itself is the lower substrate 20 in contrast to a structure in which a wiring layer is formed on a lower substrate 20 that is formed of a ceramic substrate or the like. This dispenses with the ceramic substrate or the like. As a result, the entire thickness of the semiconductor device 10 is reduced.

As illustrated in FIG. 19, the wiring layer 28 includes, for example, the wiring patterns 22, 23, and 24. The wiring patterns 22, 23, and 24 are, for example, arranged separately from each other on the same plane. The coefficient of thermal expansion of the wiring patterns 22, 23, and 24 may be, for example, approximately 15 ppm/° C. to 18 ppm/° C. In this modified example, the wiring layer 28 (wiring patterns 22, 23, and 24) includes outer side surfaces exposed from the encapsulation resin 50. The outer side surfaces are flush with outer side surfaces of the encapsulation resin 50. That is, in this modified example, the wiring patterns 22, 23, and 24 do not extend out beyond the encapsulation resin 50. As a result, the entire planar shape of the semiconductor device 10 is reduced in size.

As illustrated in FIG. 18, the lower surface of the wiring layer 28 is exposed from the encapsulation resin 50. The lower surface of the wiring layer 28 is flush with the lower surface of the encapsulation resin 50. Since the side surfaces and the lower surface of the wiring layer 28 are exposed from the encapsulation resin 50, the entire heat dissipation performance of the semiconductor device 10 is improved.

In the modified example illustrated in FIG. 18, the encapsulation resin 50 may cover a side surface of the wiring layer 28.

In the modified example illustrated in FIG. 18, the wiring patterns 22, 23, and 24 may extend to an outer side of the encapsulation resin 50.

In the modified example illustrated in FIG. 18, the encapsulation resin 50 may cover the lower surface of the wiring layer 28. The lower surface of the wiring layer 28 may be covered by a solder resist layer. In this case, the encapsulation resin 50 or the solder resist layer may be provided with an opening that partially exposes the lower surface of the wiring layer 28 as an electrode pad.

In the embodiment, the two semiconductor elements 30 are mounted on the upper surface of the lower substrate 20. However, the number of semiconductor elements 30 is not particularly limited. For example, one semiconductor element 30 may be mounted on the upper surface of the lower substrate 20. Alternatively, three or more semiconductor elements 30 may be mounted on the upper surface of the lower substrate 20.

In the embodiment, the substrate body 41 of the upper substrate 40 has a single-layer structure. Instead, for example, the substrate body 41 may have a stacked structure in which one or more wiring layers and multiple insulation layers are stacked.

In the embodiment, the semiconductor device 10 is embodied in a power semiconductor device. However, the semiconductor device 10 may be embodied in a semiconductor device other than a power semiconductor device. For example, as long as the semiconductor device 10 includes the encapsulation resin 50 encapsulating the semiconductor elements 30 disposed between the lower substrate 20 and the upper substrate 40 and the wiring layer 60 formed on the upper surface of the upper substrate 40, the remaining structures and functions are not particularly limited.

In the embodiment, the semiconductor element 30 is embodied in a power semiconductor element. However, the semiconductor element 30 may be embodied in a semiconductor element other than a power semiconductor element.

In the embodiment, the semiconductor element 30 includes the three electrode pads 31, 32, and 33. However, the number of electrode pads 31, 32, and 33 is not particularly limited. For example, a semiconductor element including two electrode pads may be used instead of the semiconductor element 30. In this case, when the two electrode pads are disposed on only the upper surface of the semiconductor element, the wiring pattern 22 may be omitted. In this case, for example, the semiconductor element 30 is mounted on the upper surface of the lower substrate 20 via the bonding portion 71.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A semiconductor device, comprising:
    a lower substrate;
    a semiconductor element mounted on an upper surface of the lower substrate;
    an upper substrate disposed on an upper surface of the semiconductor element;
    an encapsulation resin disposed between the lower substrate and the upper substrate and encapsulating the semiconductor element;
    a wiring layer disposed on an upper surface of the upper substrate; and
    a covering resin formed from a material having a coefficient of thermal expansion similar to a coefficient of thermal expansion of the encapsulation resin,
    wherein the covering resin is disposed on the upper surface of the upper substrate,
    wherein the covering resin covers a side surface of the wiring layer and an upper surface of the wiring layer and includes an opening that partially exposes the upper surface of the wiring layer,
    wherein the upper substrate includes a substrate body and an adhesive layer formed on a lower surface of the substrate body, and the upper surface of the semiconductor element is adhered to the substrate body by the adhesive layer, and
    wherein the wiring layer has a thickness that is greater than that of the substrate body.

2. The semiconductor device according to claim 1, wherein the covering resin covers an entirety of the upper surface of the upper substrate exposed from the wiring layer.

3. The semiconductor device according to claim 1, further comprising:
    an external connection terminal disposed on the upper surface of the wiring layer exposed in a bottom of the opening.

4. The semiconductor device according to claim 1, wherein the encapsulation resin and the covering resin are formed continuously and integrally with each other.

5. The semiconductor device according to claim 1, wherein the encapsulation resin and the covering resin are formed from a same resin material.

6. The semiconductor device according to claim 1, wherein the encapsulation resin covers a side surface of the upper substrate.

7. The semiconductor device according to claim 1, wherein the encapsulation resin covers a side surface of the lower substrate.

8. The semiconductor device according to claim 1, wherein the encapsulation resin covers a side surface of the lower substrate and a lower surface of the lower substrate.

9. The semiconductor device according to claim 1, wherein the encapsulation resin and the covering resin are formed from different resin materials.

10. The semiconductor device according to claim 1, further comprising:
    a metal layer formed on a lower surface of the lower substrate.

11. The semiconductor device according to claim 1, wherein a planar shape of the upper substrate is smaller than a planar shape of the lower substrate.

12. The semiconductor device according to claim 1, wherein the wiring layer includes a recess exposing an upper surface of the substrate body, and wherein the recess is filled with the covering resin.

13. The semiconductor device according to claim 1, further comprising:
    a connection member that electrically connects between the upper substrate and the lower substrate, wherein the connection member is adhered to the substrate body by the adhesive layer.

* * * * *